(12) United States Patent
Kim et al.

(10) Patent No.: US 11,686,883 B2
(45) Date of Patent: Jun. 27, 2023

(54) DISPLAY DEVICE HAVING BENDABLE AREA

(71) Applicant: Samsung Display Co., LTD., Yongin-si (KR)

(72) Inventors: Yunjae Kim, Cheonan-si (KR); Jinhyoung Kim, Seoul (KR); Jin Yong Sim, Seongnam-si (KR)

(73) Assignee: Samsung Display Co., Ltd., Yongin-si (KR)

(*) Notice: Subject to any disclaimer, the term of this patent is extended or adjusted under 35 U.S.C. 154(b) by 294 days.

(21) Appl. No.: 17/103,788

(22) Filed: Nov. 24, 2020

(65) Prior Publication Data

US 2021/0255367 A1 Aug. 19, 2021

(30) Foreign Application Priority Data

Feb. 14, 2020 (KR) .................. 10-2020-0018451
Mar. 3, 2020 (KR) .................. 10-2020-0026758

(51) Int. Cl.
*G06F 1/16* (2006.01)
*G02B 1/14* (2015.01)
(Continued)

(52) U.S. Cl.
CPC .................. *G02B 1/14* (2015.01); *G02B 1/11* (2013.01); *G06F 1/1652* (2013.01); *G06F 1/181* (2013.01); *G09F 9/301* (2013.01)

(58) Field of Classification Search
CPC ........... G02B 1/14; G02B 1/11; G06F 1/1652; G06F 1/181; G09F 9/301; H01L 2251/5338; H01L 27/3258
See application file for complete search history.

(56) References Cited

U.S. PATENT DOCUMENTS

2012/0280826 A1 11/2012 Tanaka
2016/0218305 A1 7/2016 Kim et al.
(Continued)

FOREIGN PATENT DOCUMENTS

JP          2010-266777      11/2010
KR    10-2014-0118676      10/2014
(Continued)

OTHER PUBLICATIONS

Extended European Search Report dated Jul. 8, 2021, issued in European Patent Application No. 21153664.4.

*Primary Examiner* — Anthony Q Edwards
*Assistant Examiner* — Hung Q Dang
(74) *Attorney, Agent, or Firm* — H.C. Park & Associates, PLC

(57) ABSTRACT

Provided is a display device including a display panel including a first area, a second area, and a bendable area which is disposed between the first and second areas and is bent so that the second area is disposed below the first area, a driving IC disposed below the second area, a window disposed on the first area, a window protection layer disposed on the window, and a first panel protection layer disposed below the first area. When viewed on a plane, one side of the window protection layer and one side of the window are spaced apart from a first boundary between the first area and the bendable area, and the one side of the window protection layer is disposed between the first boundary ad the one side of the window.

25 Claims, 13 Drawing Sheets

(51) Int. Cl.
　　　*G02B 1/11*　　　(2015.01)
　　　*G06F 1/18*　　　(2006.01)
　　　*G09F 9/30*　　　(2006.01)

(56) References Cited

U.S. PATENT DOCUMENTS

2019/0341443 A1　11/2019　Son et al.
2019/0377447 A1　12/2019　Lee et al.

FOREIGN PATENT DOCUMENTS

| KR | 1020180082717 | * | 7/2018 | ......... H01L 51/5253 |
| KR | 10-2019-0135173 | | 12/2019 | |
| KR | 10-2019-0140129 | | 12/2019 | |
| KR | 10-2021-0113480 | | 9/2021 | |

* cited by examiner

DISPLAY DEVICE HAVING BENDABLE AREA

CROSS-REFERENCE TO RELATED APPLICATIONS

This application claims priority from and the benefit of Korean Patent Application No. 10-2020-0018451, filed on Feb. 14, 2020, and 10-2020-0026758, filed on Mar. 3, 2020, which is hereby incorporated by reference for all purposes as if fully set forth herein

BACKGROUND

Field

Exemplary embodiments/implementations of the invention relate generally to a display device.

Discussion of the Background

Display devices such as monitors, iPads, smart phones, tablet PCs, and the like that provide images to users include display panels that display images. Various display panels such as liquid crystal display panels, organic light emitting display panels, electro wetting display panels, and electrophoretic display panels are being developed as the display panel.

Recently, a display device including a flexible display panel has been developed with the development of display devices. The display panel includes a plurality of pixels displaying an image and a driving chip for driving the pixels. The pixels are disposed on a display area of the display panel, and the driving chip is disposed on a non-display area of the display panel, which surrounds the display area. A bendable part is defined between the driving chip and the display area, and the bendable part is bent so that the driving chip is disposed under the display panel.

The above information disclosed in this Background section is only for understanding of the background of the inventive concepts, and, therefore, it may contain information that does not constitute prior art.

SUMMARY

The inventive concepts provide a display device that is capable of optimizing a stacked structure of a portion adjacent to a bendable area.

Additional features of the inventive concepts will be set forth in the description which follows, and in part will be apparent from the description, or may be learned by practice of the inventive concepts.

An embodiment of the inventive concepts provides a display device including a display panel including a first area, a second area, and a bendable area between the first and second areas, wherein the bendable area is bent so that the second area is disposed below the first area; a driving IC disposed below the second area; a window disposed on the first area; a window protection layer disposed on the window; and a first panel protection layer disposed below the first area, wherein, when viewed on a plane, one side of the window protection layer and one side of the window are spaced apart from a first boundary between the first area and the bendable area, and the one side of the window protection layer is disposed between the first boundary ad the one side of the window.

In an embodiment, the display device may further include: an impact absorption layer disposed between the window and the first area; and an anti-reflection layer disposed between the impact absorption layer and the first area, wherein, when viewed on the plane, one side of the impact absorption layer may overlap the one side of the window, and one side of the anti-reflection layer may be further spaced apart from the first boundary than the one side of the impact absorption layer.

In an embodiment, the display device may further include: a first coating layer applied on a top surface of the window protection layer; and a second coating layer applied on a bottom surface of the impact absorption layer.

In an embodiment, the display device may further include: a first adhesion layer disposed between the window protection layer and the window; a second adhesion layer disposed between the window and the impact absorption layer; a third adhesion layer disposed between the impact absorption layer and the anti-reflection layer; and a fourth adhesion layer disposed between the anti-reflection layer and the first area.

In an embodiment, when viewed on the plane, one side of the first adhesion layer overlaps the one side of the window protection layer, one side of the second adhesion layer may be disposed between the one side of the window and the one side of the anti-reflection layer, one side of the third adhesion layer may be further spaced apart from the first boundary than the one side of the anti-reflection layer, and one side of the fourth adhesion layer may overlap the one side of the anti-reflection layer.

In an embodiment, the display device may further include a protection layer spaced apart from the anti-reflection layer and disposed between the impact absorption layer and the first area to extend the bendable area and a portion of the second area, which is adjacent to the bendable area.

In an embodiment, the display device may further include: a first step compensation layer disposed between the protection layer and the driving IC; and a second step compensation layer disposed below the first step compensation layer to extend below a portion of the protection layer, which is adjacent to the first step compensation layer, wherein the second step compensation layer may be spaced apart from a second boundary between the bendable area and the second area.

In an embodiment, the first step compensation layer may have the same thickness as the protection layer in a direction perpendicular to a plane of the first area.

In an embodiment, the sum of thicknesses of the first and second step compensation layers may be the same as that of the driving IC in a direction perpendicular to a plane of the first area.

In an embodiment, the display device may further include: a first insulation tape disposed below the second step compensation layer to extend below the driving IC; a conductive layer disposed below the first insulation tape; and a second insulation tape disposed below the conductive layer.

In an embodiment, when viewed on the plane, one side of the second step compensation layer, which is adjacent to the second boundary, one side of the first insulation tape, which is adjacent to the second boundary, and one side of the conductive layer, which is adjacent to the second boundary, may be spaced apart from the second boundary to overlap each other.

In an embodiment, the display device may further include a second panel protection layer disposed between the first panel protection layer and further spaced apart from the second boundary than the first panel protection layer, wherein, when viewed on the plane, the one side of the second step compensation layer may overlap one side of the second panel protection layer.

In an embodiment, the second insulation tape may not overlap a portion of the conductive layer, which is adjacent to the one side of the conductive layer.

In an embodiment, when viewed on the plane, one side of the first panel protection layer may be disposed between the first boundary and the one side of the window protection layer.

In an embodiment, the display device may further include a cover layer disposed between the first panel protection layer and the second area and spaced apart from the bendable area.

In an embodiment, when viewed on the plane, one side of the cover layer may be further spaced apart from the first boundary than the one side of the first panel protection layer.

In an embodiment, when viewed on the plane, the one side of the window protection layer may overlap the one side of the first panel protection layer, and one side of the window may be disposed between the one side of the window protection layer and the one side of the cover layer.

In an embodiment, when viewed on the plane, the one side of the cover layer may be disposed between the one side of the window protection layer and the onside of the window.

In an embodiment, when viewed on the plane, one side of the cover layer may overlap the one side of the first panel protection layer.

In an embodiment, the display device may further include: a plate disposed between the cover layer and the second area; a spacer disposed between the plate and the second area; and a second panel protection layer disposed between the spacer and the second area.

In an embodiment, when viewed on the plane, one side of the plate and one side of the spacer may overlap one side of the cover layer.

In an embodiment, when viewed on the plane, one side of the second panel protection layer may be further spaced apart from the first boundary than the one side of the first panel protection layer, and one side of the cover layer may overlap the one side of the second panel protection layer.

In an embodiment, when viewed on the plane, one side of the second panel protection layer may be further spaced apart from the first boundary than the one side of the first panel protection layer, and one side of the cover layer may be disposed between the one side of the first panel protection layer and the one side of the second panel protection layer.

In an embodiment, when viewed on the plane, one side of the second panel protection layer may be disposed between the one side of the first panel protection layer and one side of the cover layer.

In an embodiment, the display device may further include a fifth adhesion layer disposed between the first area and the first panel protection layer, wherein the cover layer may include: a barrier layer disposed below the first panel protection layer; a cushion layer disposed below the barrier layer; a sixth adhesion layer disposed between the first panel protection layer and the barrier layer; and a seventh adhesion layer disposed between the cushion layer and the plate, wherein one side of the fifth adhesion layer may overlap the one side of the first panel protection layer, one side of the barrier layer, one side of the cushion layer, one side of the sixth adhesion layer, and one side of the seventh adhesion layer may overlap each other, and the cushion layer may be disposed directly on a bottom surface of the barrier layer.

It is to be understood that both the foregoing general description and the following detailed description are exemplary and explanatory and are intended to provide further explanation of the invention as claimed.

BRIEF DESCRIPTION OF THE FIGURES

The accompanying drawings are included to provide a further understanding of the inventive concepts, and are incorporated in and constitute a part of this specification. The drawings illustrate exemplary embodiments of the inventive concepts and, together with the description, serve to explain principles of the inventive concepts. In the drawings.

DETAILED DESCRIPTION

Figure 1:
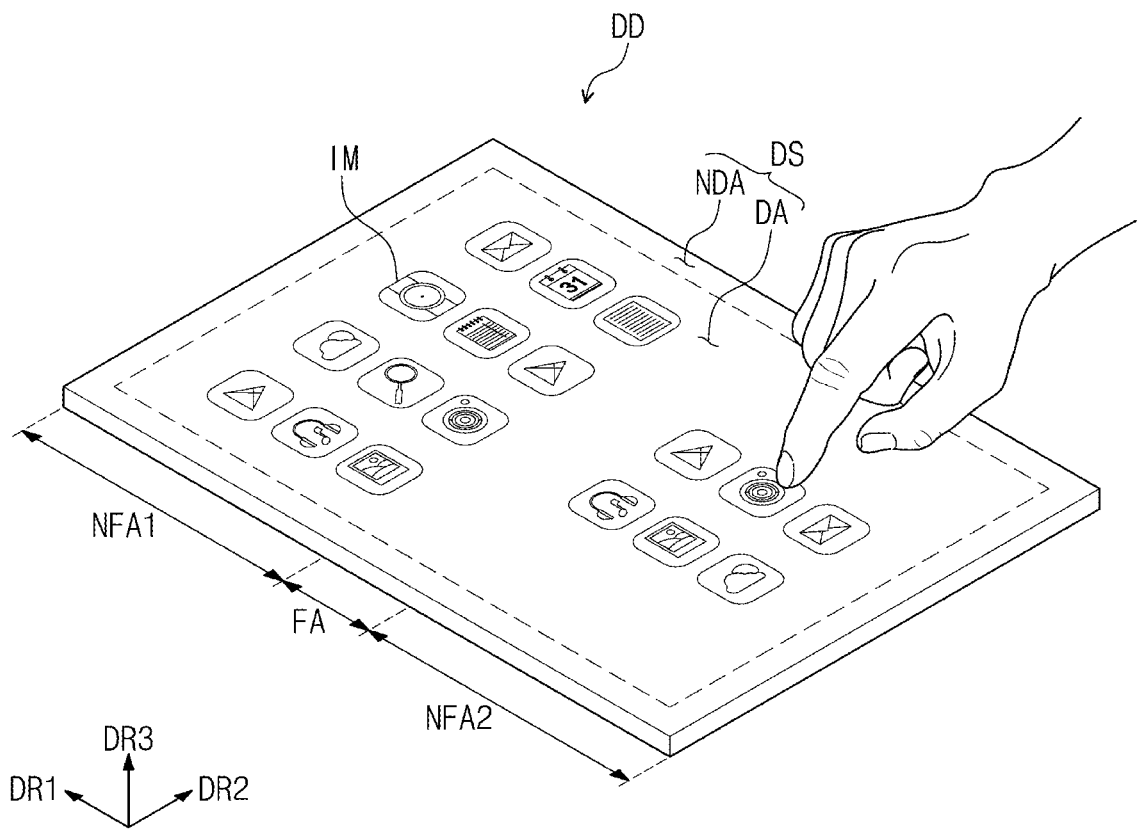
FIG. 1 is a perspective view illustrating a display device according to an embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terms "overlap" and "overlap with" may refer to one side of a layer lining up with another side of another layer along a plane. The terms "overlap" and "overlap with" may also have a meaning that one layer extends farther or shorter than another layer.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
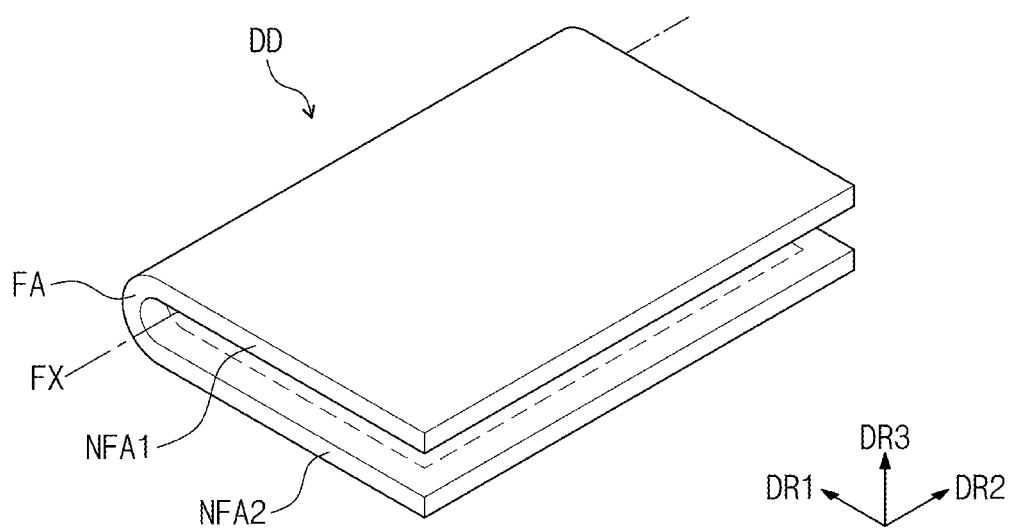
FIG. 2 is a view illustrating a folded state of the display device of FIG. 1.

FIG. 1 is a perspective view illustrating a display device according to an embodiment of the inventive concepts. FIG. 2 is a view illustrating a folded state of the display device of FIG. 1.

Referring to FIG. 1, a display device DD according to an embodiment of the inventive concepts may have a rectangular shape with long sides in a first direction DR1 and short sides in a second direction DR2 crossing the first direction DR1. However, the embodiment of the inventive concepts is not limited thereto. For example, the display device DD may have various shapes such as a circular shape, a polygonal shape, and the like. The display device DD may be a flexible display device.

Hereinafter, a direction that substantially perpendicularly crosses a plane defined by the first direction DR1 and the second direction DR2 is defined as a third direction DR3. Also, in this specification, the term "viewed from the plane" may be defined as a state when viewed in the third direction DR3.

The display device DD may include a foldable area FA and a plurality of non-foldable areas NFA1 and NFA2. The non-foldable areas NFA1 and NFA2 may include a first non-foldable area NFA1 and a second non-foldable area NFA2. The foldable area FA may be disposed between the first non-foldable area NFA1 and the second non-foldable area NFA2. The foldable area FA, the first non-foldable area NFA1, and the second non-foldable area NFA2 may be arranged in the first direction DR1. Foldable or non-foldable may refer to an ability of a designated region to fold within the designated region, not whether a non-foldable region, for example, may fold in relation to another region.

Although one foldable area FA and two non-foldable areas NFA1 and NFA2 are illustrated, the embodiment of the inventive concepts is not limited thereto. For example, the number of foldable area FA and the number of non-foldable areas NFA1 and NFA2 are not limited thereto. For example, the display device DD may include a plurality of non-foldable areas that are more than two non-foldable areas and a plurality of foldable areas between the non-foldable areas.

A top surface of the display device DD may be defined as a display surface DS and have a plane defined by the first direction DR1 and the second direction DR2. Images IM generated from the display device DD may be provided to a user through the display surface DS.

The display surface DS may include a display area DA and a non-display area NDA around the display area DA. An image may be displayed on the display area DA, but may not be displayed on the non-display area NDA. The non-display area NDA may surround the display area DA and define an edge of the display device DD, which is printed with a predetermined color.

Referring to FIG. 2, the display device DD may be a foldable-type display device DD that is capable of being folded or unfolded. For example, the foldable area FA may be bent with respect to a folding axis FX parallel to the second direction DR2, and thus, the display device DD may be folded. The folding axis may be defined as a short axis parallel to the short side of the display device DD.

When folding the display device DD, the first non-foldable area NFA1 and the second non-foldable areas NFA2 may face each other, and the display device DD may be in-folded, folded inwards, to prevent the display surface DS from being exposed to the outside.

Figure 3:
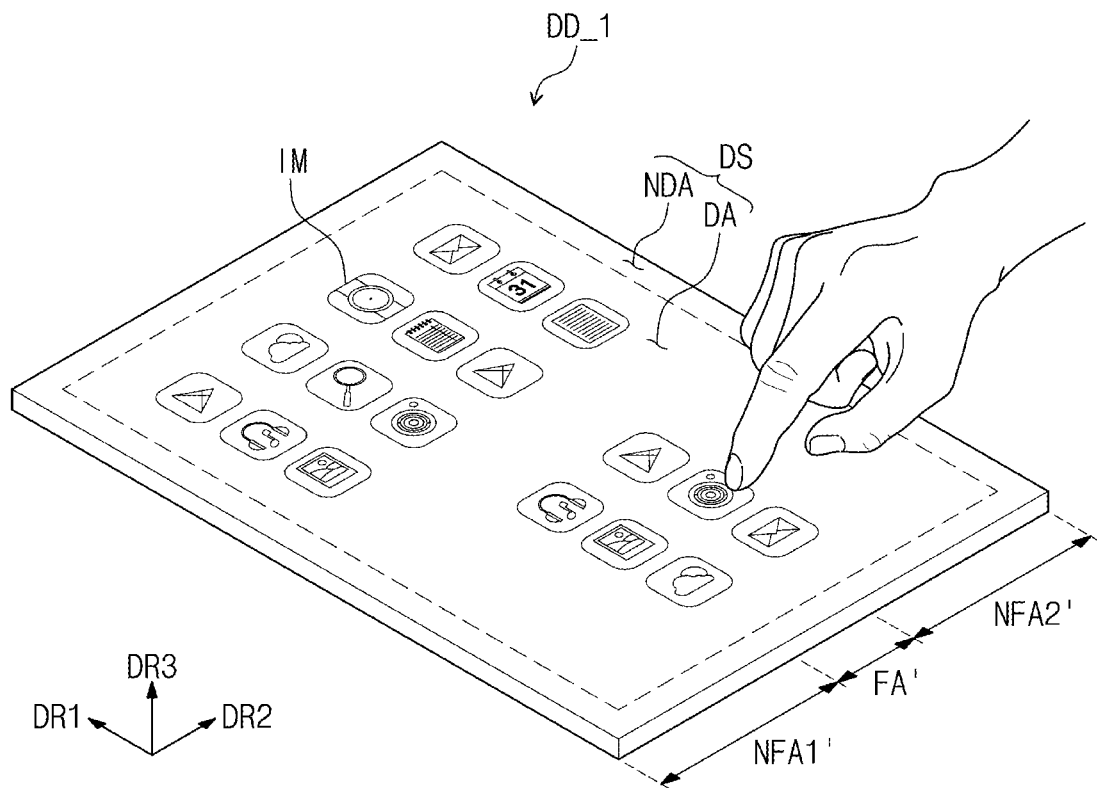
FIG. 3 is a perspective view illustrating a display device according to an embodiment of the inventive concepts.
Figure 4:
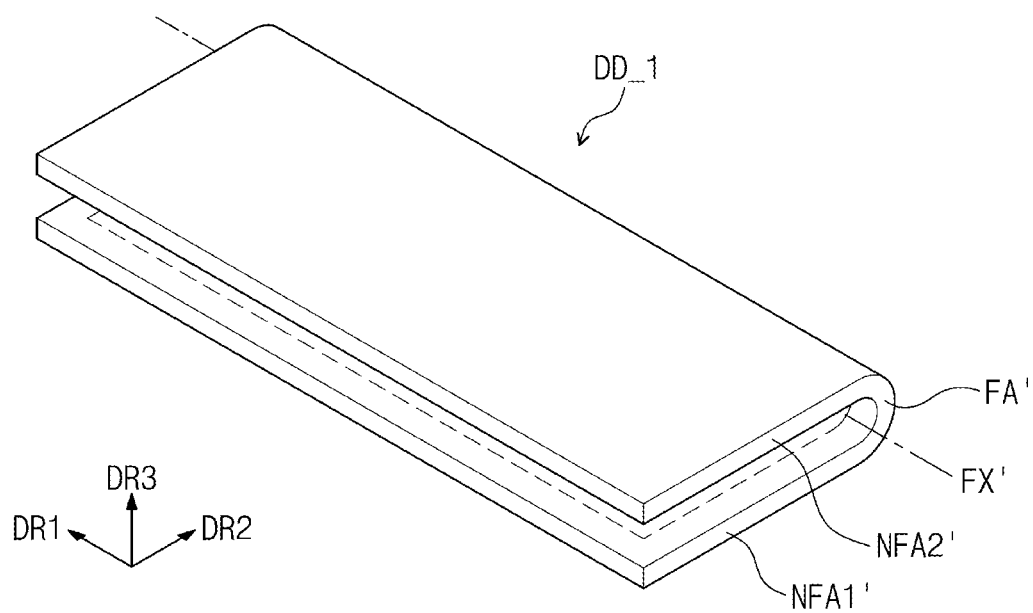
FIG. 4 is a view illustrating a folded state of the display device of FIG. 3.

FIG. 3 is a perspective view illustrating the display device according to an embodiment of the inventive concepts. FIG. 4 is a view illustrating the folded state of the display device of FIG. 3.

A display device DD_1 illustrated in FIG. 3 may have substantially the same configuration as the display device DD illustrated in FIG. 1, except for a folding operation. Thus, the folding operation of the display device DD_1 will be mainly described below.

Referring to FIGS. 3 and 4, the display device DD_1 may include a foldable area FA' and a plurality of non-foldable areas NFA1' and NFA2'. The non-foldable areas NFA1' and NFA2' may include a first non-foldable area NFA1' and a second non-foldable area NFA2'. The foldable area FA' may be disposed between the first non-foldable area NFA1' and the second non-foldable area NFA2'. The foldable area FA', the first non-foldable area NFA1', and the second non-foldable area NFA2' may be arranged in the second direction DR2.

The foldable area FA' may be bent with respect to a folding axis FX' parallel to the first direction DR1 so that the display device DD_1 is folded. The folding axis FX' may be defined as a long axis parallel to the long side of the display device DD_1. The display device DD illustrated in FIG. 1 may be folded with respect to a short axis. On the other hand, the display device DD_1 illustrated in FIG. 3 may be folded with respect to the long axis. The display device DD_1 may be in-folded so that a display surface DS is not exposed to the outside.

Hereinafter, the display device DD that is in-folded with respect to the foldable axis FX parallel to the short axis will be described as an example.

Figure 5:
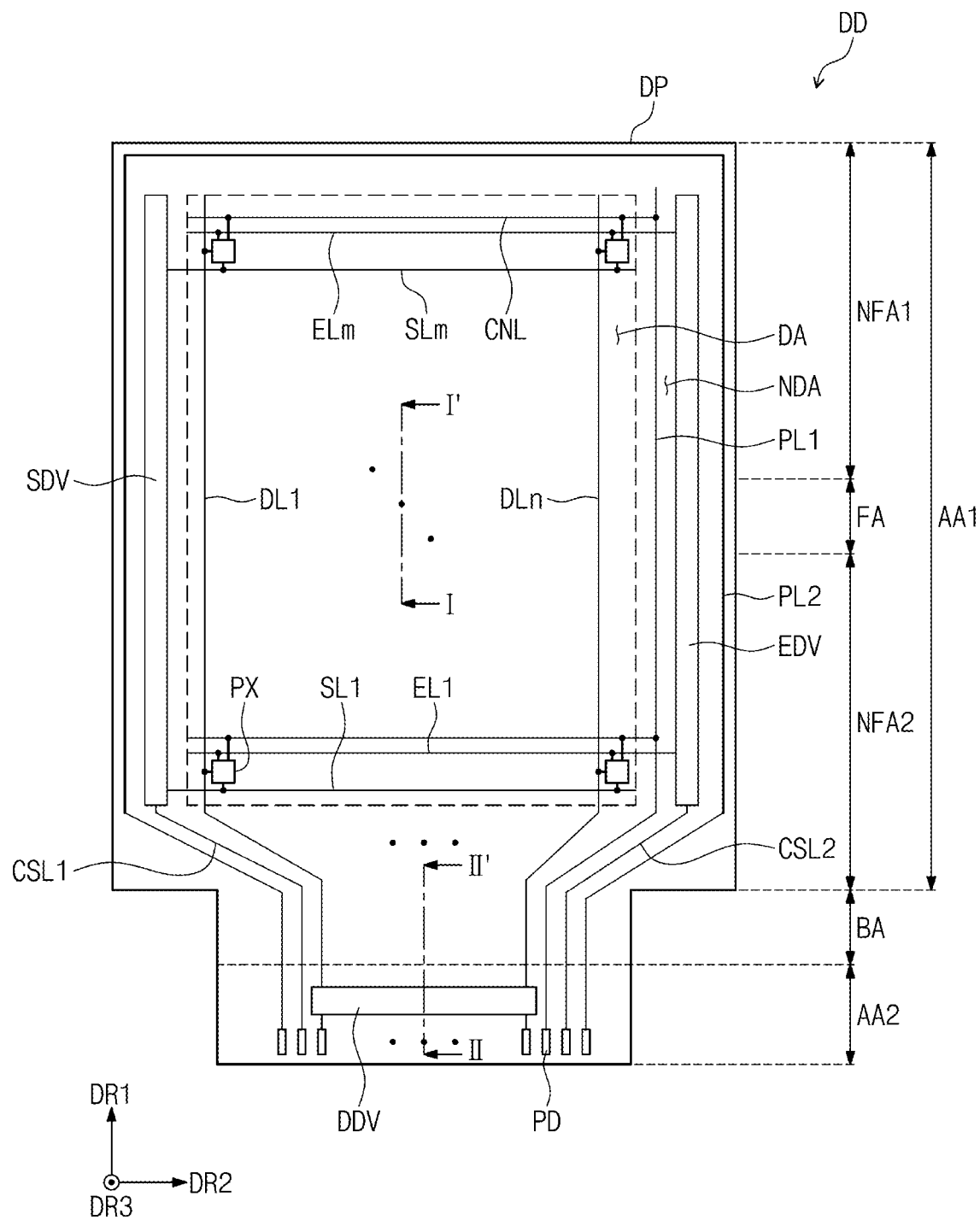
FIG. 5 is a plan view illustrating the display device of FIG. 1.

FIG. 5 is a plan view illustrating the display device of FIG. 1.

Referring to FIG. 5, the display device DD may include a display panel DP, a scan driver SDV, a data driver DDV, and an emission driver EDV.

The display panel DP according to an embodiment of the inventive concepts may be an emission type display panel, but is not limited thereto. For example, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot, a quantum rod, and the like. Hereinafter, the display panel DP is described as an organic light emitting display panel.

The display panel DP may be a flexible display panel. For example, the display panel DP may include a plurality of electronic elements disposed on a flexible substrate. The display panel DP may extend longer in the first direction DR1 than in the second direction DR2. The display panel DP may have a plane defined by the first and second directions DR1 and DR2.

The display panel DP may include a first area AA1, a second area AA2, and a bendable area BA disposed between the first area AA1 and the second area AA2. The bendable area BA extends in the second direction DR2, and the first area AA1, the bendable area BA, and the second area AA2 may be arranged in the first direction DR1.

The first area AA1 may have long sides that extend in the first direction DR1 and are opposite to each other in the second direction DR2. A length of each of the bendable area BA and the second area AA2 in the second direction DR2 may be less than that of the first area AA1.

The first area AA1 may include a display area DA and a non-display area NDA around the display area DA. The non-display area NDA may surround the display area DA. An image may be displayed on the display area DA but may not be displayed on the non-display area NDA. The second area AA2 and the bendable area BA may be areas on which an image is not displayed.

When viewed in the second direction DR2, the first area AA1 may include a first non-foldable area NFA1, a second non-foldable area NFA2, and a foldable area FA disposed between the first non-foldable area NFA1 and the second non-foldable area NFA2.

The display panel DP includes a plurality of pixels PX, a plurality of scan lines SL1 to SLm, a plurality of data lines DL1 to DLn, a plurality of emission lines EL1 to ELm, first and second control lines CSL1 and CSL2, a first power line PL1, a second power line PL2, connection lines CNL, and a plurality of pads PD. Here, m and n are natural numbers.

The pixels PX may be disposed on the display area DA and connected to the scan lines SL1 to SLm, the data lines DL1 to DLn, and the emission lines EL1 to ELm.

A scan driver SDV and an emission driver EDV may be disposed on the non-display area NDA. The scan driver SDV and the emission driver EDV may be disposed on the non-display area NDA that is adjacent to each of the long sides of the first area AA1. The data driver DDV may be disposed on the second area AA2. The data driver DDV may be manufactured in the form of an integrated circuit chip and mounted on the second area AA2.

The scan lines SL1 to SLm may extend in the second direction DR2 and be connected to the scan driver SDV. The data lines DL1 to DLn may extend in the first direction DR1 and be connected to the data driver DDV via the bendable area BA. The emission lines EL1 to ELm may extend in the second direction DR2 and be connected to a gate driver EDV.

The first power line PL1 may extend in the first direction DR1 and be disposed on the non-display area NDA. The first power line PL1 may be disposed between the display area DA and the emission driver EDV. However, the embodiment of the inventive concepts is not limited thereto, and the first power line PL1 may be disposed between the display area DA and the scan driver SDV.

The first power line PL1 may extend to the second area AA2 via the bendable area BA. The first power line PL1 may extend toward a lower end of the second area AA2 when viewed on a plane. The first power line PL1 may receive a first voltage.

The second power line PL2 may be disposed on the non-display area NDA adjacent to the long sides of the first area AA1 and the non-display area NDA facing the second area AA2 with the display area DA therebetween. The second power line PL2 may be disposed outside the scan driver SDV and the emission driver EDV.

The second power line PL2 may extend to the second area AA2 via the bendable area BA. The second power line PL2 may extend from the second area AA2 in the first direction DR1 with the data driver DDV therebetween. The second area AA2 may extend toward the lower end of the second area AA2 when viewed on the plane.

The second power line PL2 may receive a second voltage having a level less than that of the first voltage. For convenience of description, although the connection relationship is not illustrated, the second power line PL2 may extend to the display area DA and be connected to the pixels PX, and the second voltage may be provided to the pixels PX through the second power line PL2.

The connection lines CNL may extend in the second direction DR2 and may be arranged in the first direction DR1. The connection lines CNL may be connected to the first power line PL1 and the pixels PX. The first voltage may be applied to the pixels PX through the first power line PL1 and the connection lines CNL, which are connected to each other.

The first control line CSL1 may be connected to the scan driver SDV and extend toward the lower end of the second area AA2 via the bendable area BA. The second control line CSL2 may be connected to the emission driver EDV and extend toward the lower end of the second area AA2 via the bendable area BA. The data driver DDV may be disposed between the first control line CSL1 and the second control line CSL2.

When viewed on the plane, the pads PD may be disposed adjacent to the lower end of the second area AA2. The data driver DDV, the first power line PL1, the second power line PL2, the first control line CSL1, and the second control line CSL2 may be connected to the pads PD.

The data lines DL1 to DLn may be connected to corresponding pads PD through the data driver DDV. For example, the data lines DL1 to DLn may be connected to the data driver DDV, and the data drivers DDV may be connected to the pads PD, which respectively correspond to the data lines DL1 to DLn.

Although not illustrated, the display device DD may include a printed circuit board (hereinafter, illustrated in FIG. 12) connected to the pads PD and a timing controller (hereinafter, illustrated in FIG. 12) disposed on the printed circuit board. The timing controller may be manufactured as an integrated circuit chip and mounted on the printed circuit board. The timing controller may be connected to the pads PD through the printed circuit board.

The timing controller may control operations of the scan driver SDV, the data driver DDV, and the emission driver EDV. The timing controller may generate a scan control signal, a data control signal, and an emission control signal in response to control signals received from the outside.

The scan control signal may be provided to the scan driver SDV through the first control line CSL1. The emission control signal may be provided to the emission driver EDV through the second control line CSL2. The data control signal may be provided to the data driver DDV. The timing controller may receive image signals from the outside and convert a data format of the image signals to match an interface specification with the data driver DDV and thus provide the converted data format to the data driver DDV.

The scan driver SDV may generate a plurality of scan signals in response to the scan control signal. The scan signals may be applied to the pixels PX through the scan lines SL1 to SLm. The scan signals may be sequentially applied to the pixel PX.

The data driver DDV may generate a plurality of data voltages corresponding to the image signals in response to the data control signal. The data voltages may be provided to the pixels PX through the data lines DL1 to DLn. The emission driver EDV may generate a plurality of emission signals in response to the emission control signal. The emission signals may be applied to the pixels PX through the emission lines EL1 to ELm.

The pixels PX may receive the data voltages in response to the scan signals. The pixels PX may emit light having luminance corresponding the data voltages in response to the emission signals to display an image. An emission time of the pixels PX may be controlled by the emission signals.

Each of the pixels PX may include an organic light emitting element. The first voltage may be applied to an anode electrode of the organic light emitting element, and the second voltage may be applied to a cathode electrode of the organic light emitting element. The organic light emitting element may operate by receiving the first voltage and the second voltage.

Figure 6:
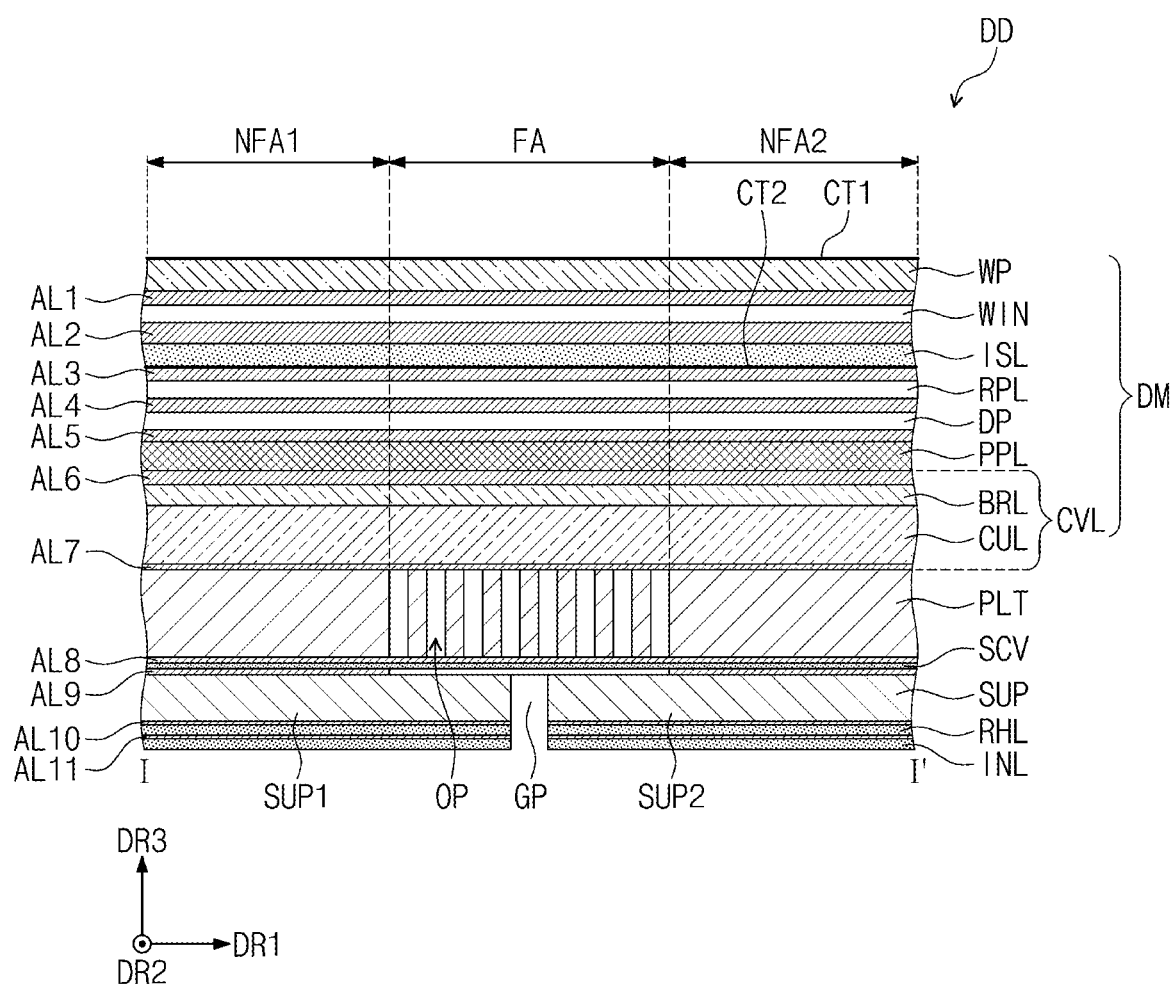
FIG. 6 is a cross-sectional view taken along line I-I' of FIG. 5.

FIG. 6 is a cross-sectional view taken along line I-I' of FIG. 5.

Referring to FIG. 6, the display device DD includes a display panel DP, an anti-reflection layer RPL, an impact absorption layer ISL, a window WIN, a window protection layer WP, a first coating layer CT1, a second coating layer CT2, a panel protection layer PPL, a cover layer CVL, a plate PLT, a sub cover layer SCV, a support SUP, a heat dissipation layer RHL, an insulation layer INL, and first to eleventh adhesion layers AL1 to AL11. A portion from the cover layer CVL to the first coating layer CT1 may be defined as a display module DM.

The anti-reflection layer RPL, the impact absorption layer ISL, the window WIN, the window protection layer WP, the first coating layer CT1, and the second coating layer CT2 may be disposed on the display panel DP. The panel protection layer PPL, the cover layer CVL, the plate PLT, the sub cover layer SCV, the support SUP, the heat dissipation layer RHL, and the insulation layer INL may be disposed under the display panel DP.

The anti-reflection layer RPL disposed on the display panel DP may be defined as an external light anti-reflection film. The anti-reflection layer RPL may reduce reflectance of external light incident from the display device DD onto the display panel DP. For example, the anti-reflection layer RPL may include a phase retarder and/or a polarizer.

The anti-reflection layer RPL may have a thickness greater than that of the display panel DP in the third direction DR3. For example, the display panel DP may have a thickness of about 30 micrometers (μm), and the anti-reflection layer RPL may have a thickness of about 31 micrometers (μm).

The impact absorption layer ISL may be disposed on the anti-reflection layer RPL. The impact absorption layer ISL may absorb an external impact applied from an upper side of the display device DD toward the display panel DP to protect the display panel DP. The impact absorption layer ISL may be manufactured in the form of a stretched film.

The impact absorption layer ISL may include a flexible plastic material. The flexible plastic material may be defined as a synthetic resin film. For example, the impact absorption layer ISL may include a flexible plastic material such as polyimide (PI) or polyethylene terephthalte (PET). The impact absorption layer ISL may have an elastic modulus of about 1 GPa or more. In an embodiment of the inventive concepts, the impact absorption layer ISL may be omitted.

The impact absorption layer ISL may have a thickness greater than that of the anti-reflection layer RPL in the third direction DR3. For example, the impact absorption layer ISL may have a thickness of about 41 micrometers (μm).

The window WIN may be disposed on the impact absorption layer ISL. The window WIN may protect the display panel DP and the anti-reflection layer RPL from external scratches. The window WIN may have optically transparent properties.

The window WIN may include glass. The window WIN may be defined as ultra-thin glass (UTG). However, the embodiment of the inventive concepts is not limited thereto, and the window WIN may include a synthetic resin film.

The window WIN may has a single layered structure or a multilayered structure. For example, the window WIN may include a plurality of plastic films bonded to each other by using an adhesive or include a glass substrate and a plastic film, which are bonded to each other by using an adhesive.

The window WIN may have a thickness less than that of each of the impact absorption layer ISL and the anti-reflection layer RPL and have the same thickness as the display panel DP. For example, the window WIN may have a thickness of about 30 micrometers (μm).

The window protection layer WP may be disposed on the window WIN. The first coating layer CT1 may be applied on a top surface of the window protection layer WP. The window protection layer WP and the first coating layer CT1 may protect the window WIN. The window protection layer WP may include a film having an elastic modulus of about 15 GPa or less at room temperature.

The window protection layer WP may include a flexible plastic material such as polyimide or polyethylene terephthalate. The first coating layer CT1 may include a hard coating layer. However, the embodiment of the inventive concepts is not limited thereto, and the first coating layer CT1 may further include an anti-fingerprint layer or a scattering prevention layer, which is defined as a functional layer.

The window protection layer WP may have a thickness greater than that of the impact absorption layer ISL in the third direction DR3. For example, the window protection layer WP may have a thickness of about 55 micrometers (μm).

The second coating layer CT2 may be applied on a bottom surface of the impact absorption layer ISL. The second coating layer CT2 may include a hard coating layer. The second coating layer CT2 may planarize the bottom surface of the impact absorption layer ISL, which may have a curved surface.

The first adhesion layer AL1 may be disposed between the window protection layer WP and the window WIN. The window protection layer WP and the window WIN may be bonded to each other by the first adhesion layer AL1. The first adhesion layer AL1 may have a thickness less than that of the window WIN. For example, the first adhesion layer AL1 may have a thickness of about 25 micrometers (μm).

The second adhesion layer AL2 may be disposed between the window WIN and the impact absorption layer ISL. The window WIN and the impact absorption layer ISL may be bonded to each other by the second adhesion layer AL2. The second adhesion layer AL2 may have a thickness greater than that of the window WIN and less than that of the impact absorption layer ISL. For example, the second adhesion layer AL2 may have a thickness of about 35 micrometers (μm).

The third adhesion layer AL3 may be disposed between the impact absorption layer ISL and the anti-reflection layer RPL. The impact absorption layer ISL and the anti-reflection layer RPL may be bonded to each other by the third adhesion layer AL3. Substantially, the third adhesion layer AL3 may adhere to the second coating layer CT2 applied on the bottom surface of the impact absorption layer ISL. The third adhesion layer AL3 may have a thickness less than that of the anti-reflection layer RPL and have the same thickness as the first adhesion layer AL1. For example, the third adhesion layer AL3 may have a thickness of about 25 micrometers (μm).

The fourth adhesion layer AL4 may be disposed between the anti-reflection layer RPL and the display panel DP. The anti-reflection layer RPL and the display panel DP may be bonded to each other by the fourth adhesion layer AL4. The fourth adhesion layer AL4 may have a thickness less than that of the display panel DP and have the same thickness as the first adhesion layer AL1. For example, the fourth adhesion layer AL4 may have a thickness of about 25 micrometers (μm).

The first to fourth adhesion layers AL1 to AL4 may include a transparent adhesive such as a pressure-sensitive adhesive (PSA) or an optically clear adhesive (OCA).

The panel protection layer PPL may be disposed under the display panel DP. The panel protection layer PPL may protect the lower portion of the display panel DP. The panel protection layer PPL may include a flexible plastic material. For example, the panel protection layer PPL may include polyethylene terephthalate (PET).

The panel protection layer PPL may have a thickness greater than that of the display panel DP in the third direction DR3. For example, the panel protection layer PPL may have a thickness of about 50 micrometers (μm).

The cover layer CVL may be disposed under the panel protection layer PPL. The cover layer CVL may define a lower portion of the display module DM. The cover layer CVL may absorb an external impact applied to the lower portion of the display module DM. The cover layer CVL may include a barrier layer BRL and a cushion layer CUL. The sixth adhesion layer AL6 and the seventh adhesion layer AL7 may be defined as constitutes of the cover layer CVL.

The barrier layer BRL may be disposed under the panel protection layer PPL. Resistance to compression force due to external pressing may increase by the barrier layer BRL. Accordingly, the barrier layer BRL may serve to prevent deformation of the display panel DP from occurring. The barrier layer BRL may include a flexible plastic material such as polyimide or polyethylene terephthalate.

The cushion layer CUL may be disposed under the barrier layer BRL. The cushion layer CUL may be configured to absorb the external impact applied to the lower portion of the display module DM to protect the display panel DP. The cushion layer CUL may include a foam sheet having predetermined elastic force. The cushion layer CUL may include foam, sponge, polyurethane, or thermoplastic polyurethane. The cushion layer CUL may be directly formed on the bottom surface of the barrier layer BRL by using the barrier layer BRL as a base layer.

The barrier layer BRL may have a thickness greater than that of the display panel DP and less than that of the panel protection layer PPL in the third direction DR3. For example, the barrier layer BRL may have a thickness of about 35 micrometers (μm). The cushion layer CUL may have a thickness greater than that of the panel protection layer PPL. For example, the cushion layer CUL may have a thickness of about 100 micrometers (μm).

At least one of the barrier layer BRL or the cushion layer CUL may have a color that is configured to absorb light. For example, at least one of the barrier layer BRL or the cushion layer CUL may have a black color. In this case, when the display device DD is viewed above, components disposed under the cover layer CVL may not be seen.

The plate PLT may be disposed under the cover layer CVL (for example, the cushion layer CUL). The plate PLT may include a material having an elastic modulus of about 60 GPa or more. The plate PLT may include a metal material such as stainless steel. For example, the plate PLT may include SUS 304, but is not limited thereto, and the plate PLT may include various metal materials. The plate PLT may support the display module DM. Also, heat dissipation performance of the display device DD may be improved by the plate PLT.

When viewed on the plane, a plurality of openings OP may be disposed in a portion of the plate PLT overlapping and extending a length of the foldable area FA. The plurality of openings OP may extend from the seventh adhesion layer AL7 to the eighth adhesive layer ALB, but embodiments are not limited thereto. If the display panel DP includes different configurations of adhesion and other layers surrounding the plate, the plurality of openings OP may be disposed within the plate PLT within those layers. A portion of the plate PLT overlapping the foldable area FA may be easily deformed by the openings OP. The plate PLT may have a thickness greater than that of the cushion layer CUL in the third direction DR3. For example, the plate PLT may have a thickness of about 150 micrometers (μm).

The fifth adhesion layer AL5 may be disposed between the display panel DP and the panel protection layer PPL. The display panel DP and the panel protection layer PPL may be bonded to each other by the fifth adhesion layer AL5. The fifth adhesion layer AL5 may have a thickness less than that of the display panel DP in the third direction DR3. For example, the fifth adhesion layer AL5 may have a thickness of about 18 micrometers (μm).

The sixth adhesion layer AL6 may be disposed between the panel protection layer PPL and the barrier layer BRL. The panel protection layer PPL and the barrier layer BRL may be bonded to each other by the sixth adhesion layer AL6. The sixth adhesion layer AL6 may have a thickness less than that of the display panel DP and greater than that of the fifth adhesion layer AL5 in the third direction DR3. For example, the sixth adhesion layer AL6 may have a thickness of about 25 micrometers (μm).

The seventh adhesion layer AL7 may be disposed between the cushion layer CUL and the plate PLT. The cushion layer CUL and the plate PLT may be bonded to each other by the seventh adhesion layer AL7. The seventh adhesion layer AL7 may have a thickness less than that of the fifth adhesion layer AL5 in the third direction DR3. For example, the seventh adhesion layer AL7 may have a thickness of about 8 micrometers (μm).

The fifth to seventh adhesion layers AL5 to AL7 may include a transparent adhesive such as a pressure-sensitive adhesive or an optically transparent adhesive.

The sub cover layer SCV may be disposed under the plate PLT. The sub cover layer SCV may cover the openings OP defined in the plate PLT. The sub cover layer SCV may have an elastic modulus less than that of the plate PLT. For example, the sub cover layer SCV may include thermoplastic polyurethane or rubber, but is not limited thereto.

The sub cover layer SCV may be manufactured in the form of a sheet and attached to the plate PLT. The eighth adhesion layer AL8 may be disposed between the sub cover layer SCV and the plate PLT, and the sub cover layer SCV and the plate PLT may be bonded to each other by the eighth adhesion layer AL8. The sub cover layer SCV may prevent foreign substances from being introduced into the openings OP defined in the plate PLT.

Each of the sub cover layer SCV and the eighth adhesion layer AL8 may have the same thickness as the sixth adhesion layer AL6 in the third direction DR3. For example, each of the sub cover layer SCV and the eighth adhesion layer AL8 may have a thickness of about 8 micrometers (μm).

Figure 7:
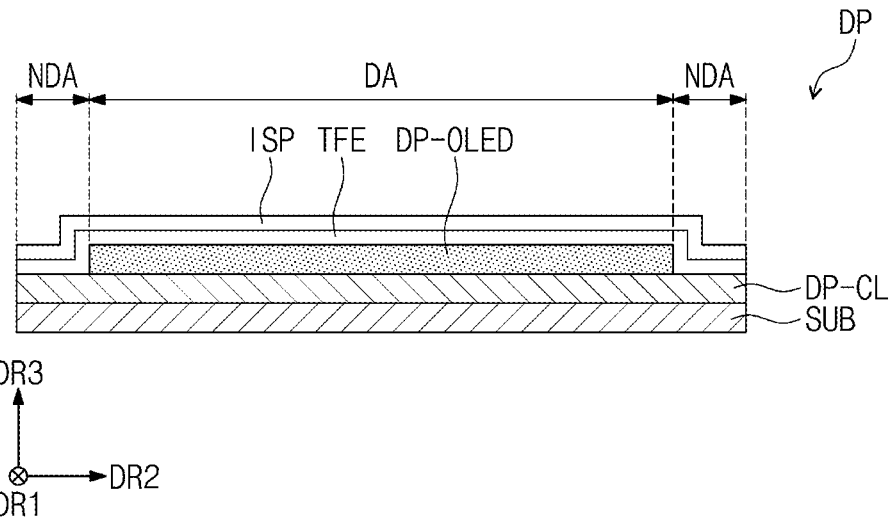
FIG. 7 is an exemplarily cross-sectional view illustrating a display module of FIG. 6.

The support SUP may be disposed under the sub cover layer SCV. The support SUP may support the first non-foldable area NFA1 and the second non-foldable area NFA2 of the display module DM of the display panel DP in a folded configuration (FIG. 7). In a non-folded configuration as illustrated in FIG. 6, the support SUP may also support the foldable area FA. The support SUP may include a metal. For example, the support SUP may include a copper alloy. However, this is illustratively described, and the support SUP may include various metals (for example, invar or stainless steel).

The support SUP may include a first support SUP1 and a second support SUP2, which are arranged in the first direction DR1. The first support SUP1 may overlap the first non-foldable area NFA1 to support the first non-foldable area NFA1. The second support SUP2 may overlap the second non-foldable area NFA2 to support the second non-foldable area NFA2. The first support SUP1 and the second support SUP2 may extend into the foldable area FA and be spaced apart from each other on the foldable area FA.

The first support SUP1 and the second support SUP2 may be disposed adjacent to each other within the foldable area FA with a gap region GP disposed therebetween. The gap GP may be a space between the first support SUP1 and the second support SUP2 or no gap GP may exist such that the first support SUP1 and SUP2 are substantially flush with each other. The first support SUP1 and the second support SUP2 may support a portion of the plate PLT in which the openings OP are defined in the foldable area FA. Thus, when a pressure is applied to a portion of the plate PLT, in which the openings OP are defined, from the upper side, the portion of the plate in which the openings OP are defined may be prevented from being deformed because of the support SUP. The support SUP may prevent the shape of each of the constituents disposed on the support SUP from being deformed by the constituents disposed under the support SUP.

The support SUP may have a thickness less than that of the cushion layer CUL in the third direction DR3. For example, the support SUP may have a thickness of about 80 micrometers (μm).

The ninth adhesion layer AL9 may be disposed between the support SUP and the sub cover layer SCV. The support SUP and the sub cover layer SCV may be bonded to each other by the ninth adhesion layer AL9. The ninth adhesion layer AL9 may be disposed in an area overlapping the first non-foldable area NFA1 and an area overlapping the second non-foldable area NFA2. The ninth adhesion layer AL9 may not be disposed on a portion of the first support SUP1 overlapping the foldable area FA and a portion of the second support SUP2 overlapping the foldable area FA. The eighth adhesion layer AL8, the sub cover layer SCV, and the ninth adhesion layer AL9 may extend over the gap region GP.

The ninth adhesion layer AL9 may be the same thickness as the eighth adhesion layer AL8 in the third direction DR3. For example, the ninth adhesion layer AL9 may have a thickness of about 8 micrometers (μm).

The heat dissipation layer RHL may be disposed under the support SUP and on either side of the gap GP. The heat dissipation layer RHL may be a thermally conductive sheet having high thermal conductivity. The heat dissipation layer RHL may have a heat dissipation function. The heat dissipation layer RHL may have a thickness greater than that of the sub cover layer SCV in the third direction DR3. For example, the heat dissipation layer RHL may have a thickness of about 17 micrometers (μm).

The tenth adhesion layer AL10 may be disposed between the heat dissipation layer RHL and the support SUP and may be disposed on either side of the gap GP. The tenth adhesion layer AL10 may be disposed between the first support SUP1 and the heat radiation layer RHL and between the second support SUP2 and the heat radiation layer RHL. The heat dissipation layer RHL and the support SUP may be bonded to each other by the tenth adhesion layer AL10. The tenth adhesion layer AL10 may have a thickness less than that of the ninth adhesion layer AL9 in the third direction DR3. For example, the tenth adhesion layer AL10 may have a thickness of about 5 micrometers (μm).

The insulation layer INL may be disposed under the heat dissipation layer RHL. Two sides of the heat dissipation layer may be separated by the gap GP. The insulation layer INL may have a thickness less than that of the heat dissipation layer RHL in the third direction DR3. For example, the insulation layer INL may have a thickness of about 15 micrometers (μm).

The eleventh adhesion layer AL11 may be disposed between the insulation layer INL and the heat radiation layer RHL. The insulation layer INL and the heat dissipation layer RHL may be bonded to each other by the eleventh adhesion layer AL11. The insulation layer INL may have two portions divided by the gap GP. The eleventh adhesion layer AL11 may have the same thickness the tenth adhesion layer AL10. For example, the eleventh adhesion layer AL11 may have a thickness of about 5 micrometers (μm).

The eighth to eleventh adhesion layers AL8 to AL11 may include a transparent adhesive such as a pressure-sensitive adhesive or an optically transparent adhesive.

FIG. 7 is an exemplarily cross-sectional view illustrating the display module of FIG. 6.

For example, FIG. 7 illustrates a cross-sectional view of the display panel as viewed in the first direction DR1.

Referring to FIG. 7, the display panel DP may include a substrate SUB, a circuit element layer DP-CL disposed on the substrate SUB, and a display element layer DP-OLED disposed on the circuit element layer DP-CL, a thin film encapsulation layer TFE disposed on the display element layer DP-OLED, and an input sensing part ISP disposed on the thin film encapsulation layer TFE. The display element layer DP-OLED may be disposed on the display area DA.

The substrate SUB may include a display area DA and a non-display area NDA around the display area DA. The substrate SUB may include a flexible plastic material. For example, the substrate SUB may include polyimide (PI).

The circuit element layer DP-CL may include an insulation layer, a semiconductor pattern, a conductive pattern, and a signal line. The insulation layer, the semiconductor layer, and the conductive layer may be disposed on the substrate SUB in a manner such as coating, deposition, and the like. Thereafter, the insulation layer, the semiconductor layer, and the conductive layer may be selectively patterned through a plurality of photolithography processes to form the semiconductor pattern, the conductive pattern, and the signal line.

The circuit element layer DP-CL may include transistors constituted by the semiconductor pattern, the conductive pattern, and the signal lines. The display element layer DP-OLED may include light emitting elements connected to the transistors. The pixels PX may include the transistors and the light emitting elements.

The thin film encapsulation layer TFE may be disposed on the circuit element layer DP-CL to cover the display element layer DP-OLED. The thin film encapsulation layer TFE may include an inorganic layer, an organic layer, and an inorganic layer, which are sequentially laminated. Each of the inorganic layers may include an inorganic material and protect the pixels against moisture/oxygen. The organic layer includes an organic material and may protect the pixels PX against foreign materials such as dust particles.

The input sensing part ISP may include a plurality of sensors (not illustrated) configured to sense an external input. The sensors may sense the external input in a capacitive manner. The external input may include various types of inputs such as a portion of the user's body, light, heat, a pen, or a pressure.

The input sensing part ISP may be directly manufactured on the thin film encapsulation layer TFE when the display panel DP is manufactured. However, the embodiment of the inventive concepts is not limited thereto, and the input sensing part ISP may be provided as a panel that is separated from the display panel DP and may be attached to the display panel DP by an adhesion layer.

Figure 8:
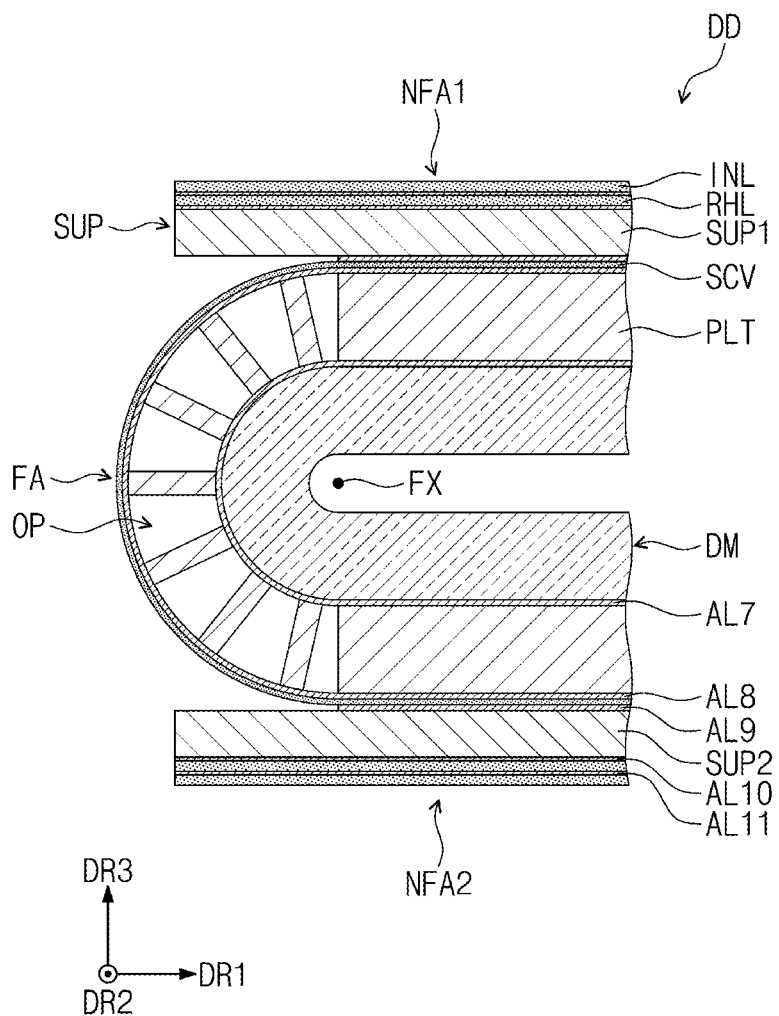
FIG. 8 is a view illustrating an in-folded state of the display device of FIG. 6.

FIG. 8 is a view illustrating an in-folded state of the display device of FIG. 6.

For example, in FIG. 8, detailed constituents of the display module DM are not illustrated.

Referring to FIG. 8, the display device DD may be in-folded with respect to the foldable axis FX. The foldable area FA may be bent so that the first non-foldable area NFA1 and the second non-foldable area NFA2 face each other. The first non-foldable area NFA1 overlapping the first support SUP1 and the second non-foldable area NFA2 overlapping the second support SUP2 may be maintained in a flat state. When the display device DD is folded, the first support SUP1 and second support SUP2 maintain their flat orientation. When the display device DD is folded, the plate PLT including the plurality of openings and the display module DM is folded about the folding axis FX into the in-folded state.

The display device DD may be changed from the flat first un-folded state of FIG. 6 to the folded second state of FIG. 8 or changed from the folded second state to the first un-folded state. The folding and un-folding operations may be performed repeatedly.

Because the display module DM is a flexible display module, the foldable area FA of the display module DM may be easily bent. However, because each of the first and second supports SUP1 and SUP2 has a rigid type, the first and second supports SUP1 and SUP2 may not be bent.

When the ninth adhesion layer AL9 is disposed up to the foldable area FA, the first and second supports SUP1 and SUP2 may be attached to the sub cover layer SCV on the foldable area FA. That is, the first and second supports SUP1 and SUP2 may be attached to the foldable area FA of the display module DM through the ninth adhesion layer AL9, the eighth adhesion layer AL8, and the seventh adhesion layer AL7.

If the first and second supports SUP1 and SUP2 are attached to the foldable area FA of the display module DM, the foldable area FA may not be well bent due to the first and second supports SUP1 and SUP2. Therefore, the foldable operation of the display module DM may be difficult.

In an embodiment of the inventive concepts, the ninth adhesion layer AL9 may not be disposed on the area overlapping the foldable area FA. Accordingly, because portions of the first and second supports SUP1 and SUP2 overlapping the foldable area FA are not attached to the display module DM, the foldable area FA may be easily bent.

The plurality of openings OP overlapping the foldable area FA may be defined in the plate PLT. Therefore, during the folding operation, a portion of the plate PLT overlapping the foldable area FA may be easily bent in the openings OP region. When the foldable area FA is folded, the openings may change from rectangular shapes of substantially the same width to trapezoidal shapes of varying widths as the space between the openings OP expands. Openings OP of smaller widths are positioned closer to the first and second supports SUP1 and SUP2. The smaller portion of the trapezoid shape is closer to the display module DM.

Figure 9:
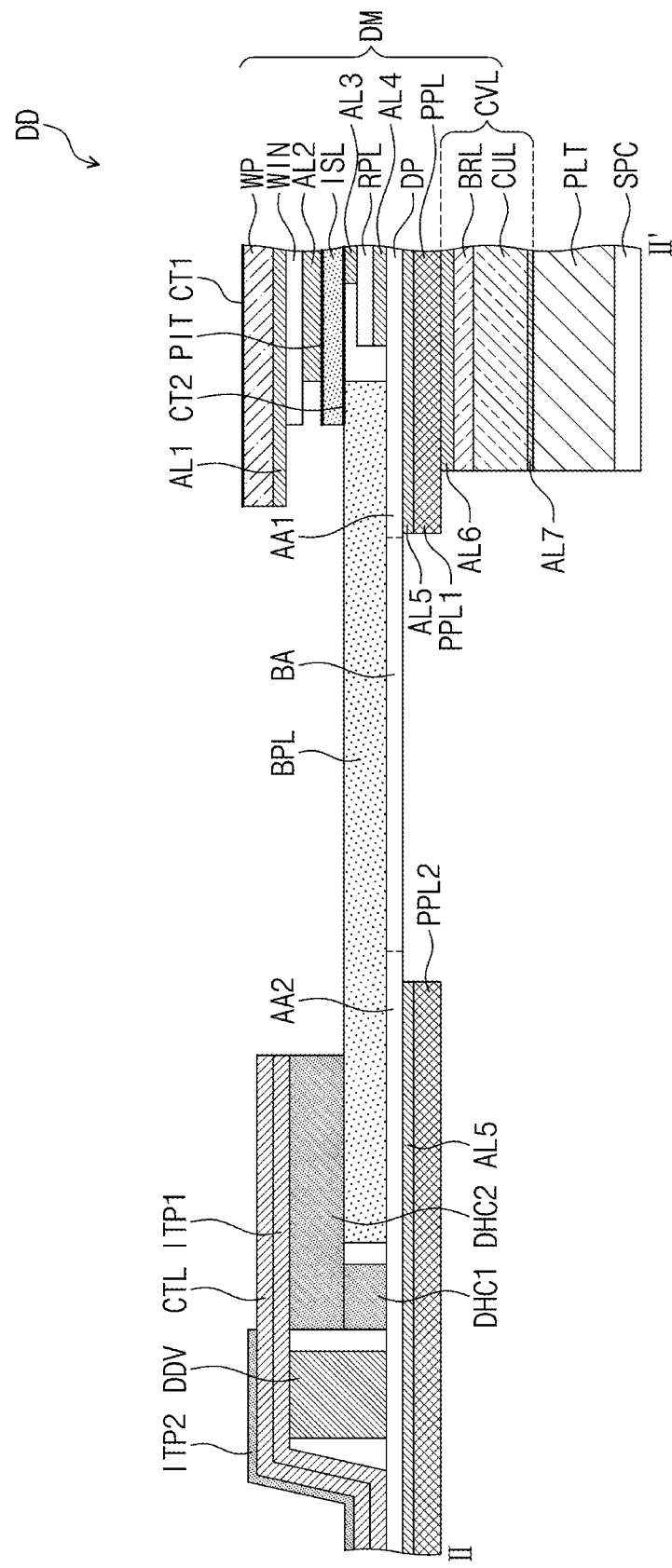
FIG. 9 is a cross-sectional view taken along line II-IF of FIG. 5.
Figure 10:
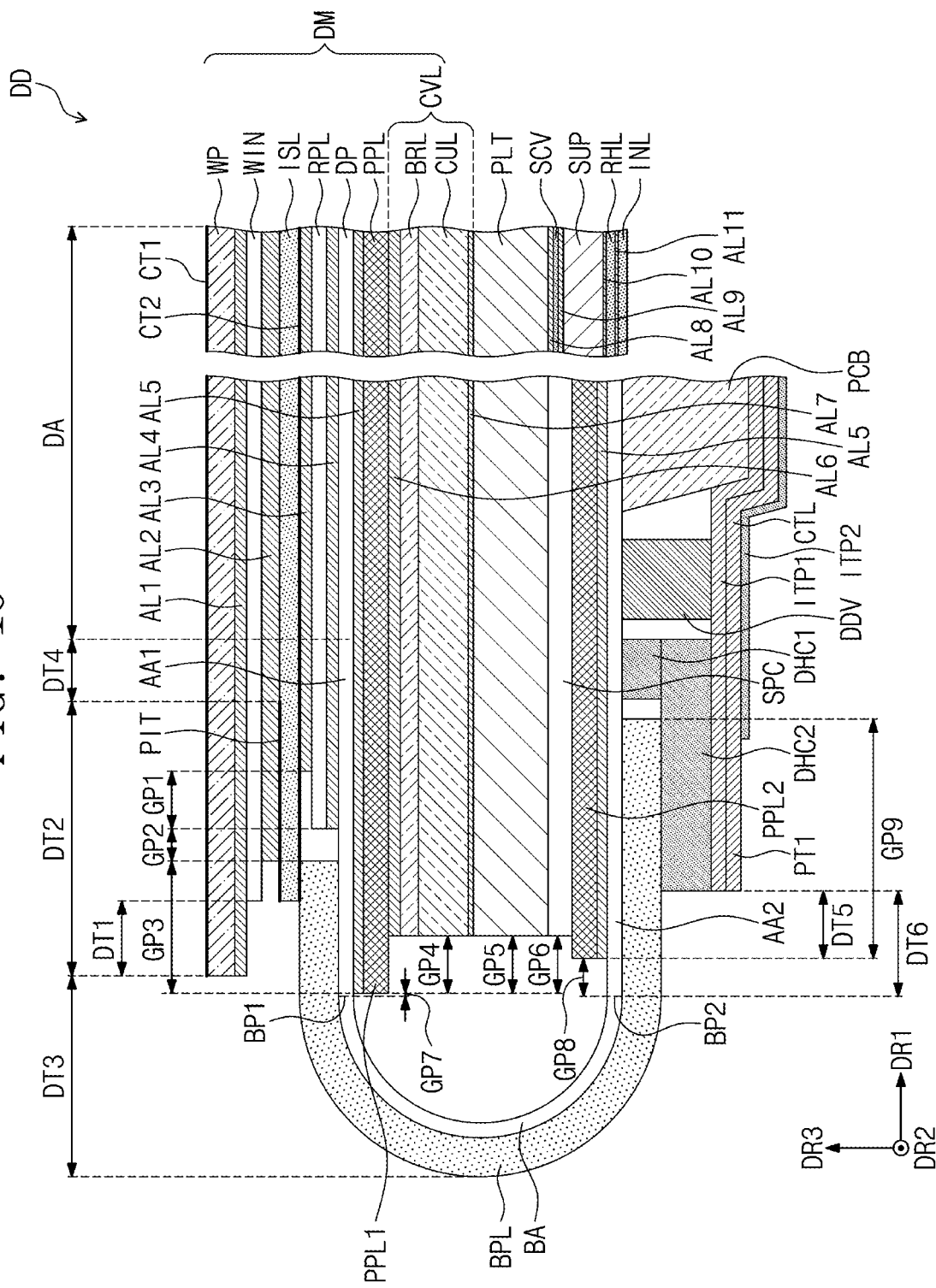
FIG. 10 is a view illustrating a folded state of the bendable area of FIG. 9.
Figure 11:
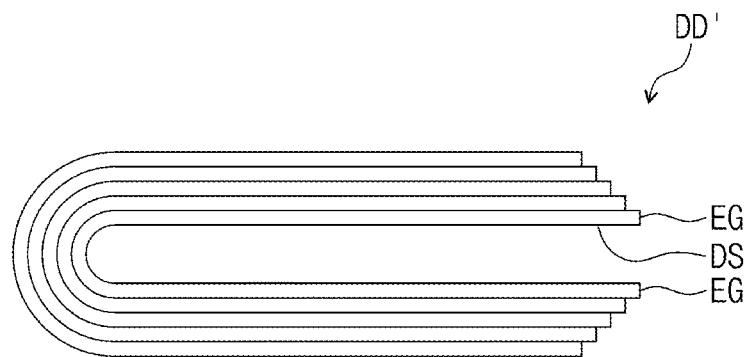
FIG. 11 is a view illustrating a folded state of a comparative display device.

FIG. 9 is a cross-sectional view taken along line II-IF of FIG. 5. FIG. 10 is a view illustrating a folded state of the bendable area of FIG. 9. FIG. 11 is a view illustrating a folded state of a comparative display device.

Referring to FIGS. 9 and 10, the data driver DDV may be disposed on the second area AA2. The data driver DDV may be defined as a driving integrated circuit (IC). The bendable area BA may be bent so that the second area AA2 is disposed under the first area AA1. Therefore in a bent state, the data driver DDV may be disposed under the first area AA1.

The bendable area BA may be bent to be a convex shape toward an outside of the display panel DP. The bendable area BA may be bent to have a predetermined curvature. Because the second area AA2 is disposed under the first area AA1, the data driver DDV that is disposed above the first area AA1 in FIG. 9 in an un-bent state may be disposed under the second area AA2 in FIG. 10 in the bent state.

The display device DD may include a protection layer BPL. The protection layer BPL may be disposed on the bendable area BA, a portion of the first area AA1 adjacent to the bendable area BA, and a portion of the second area AA2 adjacent to the bendable area BA. The protection layer BPL may continuously extend from a portion of the first area AA1 adjacent to the bendable area BA to the bendable area BA and a portion of the second area AA2 adjacent to the bendable area BA.

The protection layer BPL may be spaced apart from the anti-reflection layer RPL and be disposed between the impact absorption layer ISL and the first area AA1 of the display panel DP. The protection layer BPL may be spaced apart from the data driver DDV on the second area AA2. The protection layer BPL may include an acrylic resin or a urethane resin. The protection layer BPL may be bent together with the bendable area BA.

The protection layer BPL may serve to protect the bendable area BA. The protection layer BPL may cover lines disposed on the bendable area BA to protect the lines disposed on the bendable area BA. The protection layer BPL may complement stiffness of the bendable area BA, and when the bendable area BA is bent, the bendable area BA may be prevented from being cracked. The protection layer BPL may protect the bendable area BA against an external impact. The protection layer BPL may have a thickness of about 80 micrometers (μm) in the third direction DR3.

The panel protection layer PPL may not be disposed on the area overlapping the bendable area BA. The panel protection layer PPL may be disposed external to the bendable area BA. The panel protection layer PPL may include a first panel protection layer PPL1 disposed under the first area AA1 and a second panel protection layer PPL2 disposed under the second area AA2. When the bendable area BA is bent, the second panel protection layer PPL2 may be disposed under the first area AA1 and the first panel protection layer PPL1 together with the second area AA2.

Because the panel protection layer PPL is not disposed on the bendable area BA, the bendable area BA may be more easily bent. If the panel protection layer PPL is disposed up to the bendable area BA, the thickness of the area on which the bendable area BA is disposed may be thicker, and the bending of the bendable area BA may be difficult.

Hereinafter, the constituents of the display device DD will be described based on the bendable structure illustrated in FIG. 10.

Referring to FIG. 10, the anti-reflection layer RPL, the impact absorption layer ISL, the window WIN, the window protection layer WP, the first coating layer CT1, and the second coating layer CT2 may be disposed on the first area AA1. The panel protection layer PPL, the cover layer CVL, and the plate PLT may be disposed under the first area AA1. The panel protection layer PPL, the cover layer CVL, and the plate PLT may be disposed between the first area AA1 and the second area AA2 when the display device DD is in a bent state.

Hereinafter, one side of each of the constituents represents one side disposed adjacent to the bendable area BA. In addition, descriptions of "spacing", "overlapping", and "disposition" on one side indicate a state when viewed on the plane, and a distance and interval are values measured in a horizontal direction (for example, the first direction DR1).

When viewed on the plane, one side of the window protection layer WP and one side of the window WIN may not overlap the bendable area BA. One side of the window protection layer WP and one side of the window WIN may be spaced apart from a first boundary BP1 between the first area AA1 and the bendable area BA. One side of the window protection layer WP may be disposed between the first boundary BP1 and one side of the window WIN. One side of the first adhesion layer AL1 may overlap one side of the window protection layer WP adjacent the window WIN.

When the display device DD is folded, the window protection layer WP may be pushed outward further than other layers by the adhesion layers having fluidity. For example, when a comparative display device DD' illustrated in FIG. 11 is in-folded, one side EG of one surface DS of the comparative display device DD' (corresponding to the display surface illustrated in FIG. 1) may protrude further to the outside of the comparative display device DD'. The one side EG of the one surface of the comparative display device DD' may indicate one side of the window protection layer WP.

When the window protection layer WP is disposed to extend more outward than the position illustrated in FIG. 10 to overlap the bendable area BA, during the bending operation of the display device DD, the window protection layer WP may further protrude outward than the bendable area BA. In this case, although not illustrated, the window protection layer WP may contact a structure such as a case disposed outside the display module DM so as to be damaged.

For example, although the window protection layer WP has been described, when the window WIN also extends to the bendable area BA to overlap the bendable area BA, the window WIN may contact the case disposed outside the display module DM so as to be damaged.

In an embodiment of the inventive concepts, the window protection layer WP and the window WIN may be arranged to be spaced a predetermined distance from the first boundary BP1 so as not to overlap the bendable area BA. Accordingly, even if the display device DD is folded, the window protection layer WP and the window WIN may not protrude outward from the bendable area BA. As a result, the window protection layer WP and the window WIN may be prevented from being damaged. The window protection layer WP may have a width greater than that of the window WIN in the horizontal direction and be disposed to cover the window WIN so as to sufficiently protect the window WIN.

The impact absorption layer ISL may be disposed between the window WIN and the first area AA1 of the display panel DP. The anti-reflection layer RPL may be disposed between the impact absorption layer ISL and the first area AA1 of the display panel DP. One side of the impact absorption layer ISL and one side of the anti-reflection layer RPL may be spaced apart from the first boundary BP1.

One side of the impact absorption layer ISL may overlap with one side of the window WIN. However, the embodiment of the inventive concepts is not limited thereto, and one side of the impact absorption layer ISL may be spaced apart from one side of the window WIN. One side of the anti-reflection layer RPL may be spaced apart a longer distance from the first boundary BP1 than one side of the impact absorption layer ISL. The impact absorption layer ISL may overlap the protection layer BPL.

The display device DD may include a printed layer PIT disposed on a portion of the impact absorption layer ISL adjacent to one side of the impact absorption layer ISL. Although not illustrated, the printed layer PIT may extend along one side of the first area AA1 to overlap the non-display area NDA. The printed layer PIT may be disposed between the second adhesion layer AL2 and the impact absorption layer ISL. For example, the printed layer PIT may include black, but is not limited thereto, and the printed layer PIT may include various colors.

One side of the second adhesion layer AL2 may be further spaced apart a shorter distance from the first boundary BP1 than one side of the window WIN. One side of the second adhesion layer AL2 may be disposed between one side of the window WIN and one side of the anti-reflection layer RPL. One side of the second adhesion layer AL2 may extend to one side of the protection layer BPL adjacent to the first boundary BP1, but is not limited thereto. That is, the one side of the second adhesion layer AL2 may be spaced apart from the one side of the protection layer BPL adjacent to the first boundary BP1 or extend to overlap with the protection layer BPL.

One side of the third adhesion layer AL3 may be spaced apart a longer distance from the first boundary BP1 than one side of the anti-reflection layer RPL. One side of the fourth adhesion layer AL4 disposed between the anti-reflection layer RPL and the first area AA1 may overlap with, have a same boundary of, one side of the anti-reflection layer RPL.

One side of the first panel protection layer PPL1 may be spaced apart from the first boundary BP1 by a gap GP7. One side of the first panel protection layer PPL1 may be closer to the first boundary BP1 than one side of the window protection layer WP. Accordingly, the one side of the first panel protection layer PPL1 may be disposed between the first boundary BP1 and the one side of the window protection layer WP. The fifth adhesion layer AL5 disposed between the first area AA1 and the first panel protection layer PPL1 may overlap with one side of the first panel protection layer PPL1.

A gap GP1 between one side of the third adhesion layer AL3 and one side of the anti-reflection layer RPL may be about 0.160 mm±0.16 mm. A gap GP2 between one side of the anti-reflection layer RPL and one side of the protection layer BPL adjacent to the first boundary BP1 may be about 0.128 mm±0.112 mm. A gap GP3 between one side of the protection layer BPL adjacent to the first boundary BP1 and one side of the first panel protection layer PPL1 may be about 0.444 mm±0.141 mm.

A distance DT1 between one side of the window protection layer WP and one side of the window WIN may be about 0.18 mm to about 0.196 mm. One side of the printed layer PIT may overlap with one side of the impact absorption layer ISL. A distance DT2 between the other side of the printed layer PIT, which is opposite to one side of the printed layer PIT, and one side of the window protection layer WP may be about 0.986 mm.

A distance DT3 between a portion of the protection layer BPL disposed on the outermost side of the bendable area BA in the first direction DR1 and one side of the window protection layer WP may be about 0.446 mm. A distance DT4 between the other side of the printed layer PIT and the boundary of the display area DA of the display panel DP may be about 0.2 mm.

The cover layer CVL may be disposed between the first panel protection layer PPL1 and the second area AA2 of the display panel DP so as to be spaced apart from the first boundary BP1. One side of the cover layer CVL may be further spaced apart from the first boundary BP1 than one side of the first panel protection layer PPL1. One side of the cover layer CVL may be disposed between one side of the window protection layer WP and one side of the window WIN.

The barrier layer BRL of the cover layer CVL may be disposed under the first panel protection layer PPL1, and the sixth adhesion layer AL6 may be disposed between the first panel protection layer PPL1 and the barrier layer BRL. One side of the barrier layer BRL, one side of the cushion layer CUL, one side of the sixth adhesion layer AL6, and one side of the seventh adhesion layer AL7 may overlap with each other, but embodiments are not limited thereto and may not overlap each other.

The plate PLT may be disposed between the cover layer CVL and the second area AA2. The display device DD may include a spacer SPC disposed between the plate PLT and the second area AA2. Specifically, the plate PLT may be disposed between the cover layer CVL and the spacer SPC, and the spacer SPC may be disposed between the plate PLT and the second panel protection layer PPL2. One side of the plate PLT and one side of the spacer SPC may overlap with one side of the cover layer CVL, but embodiments are not limited thereto and may not overlap with each other.

The spacer SPC may be a double-sided tape. For example, the spacer SPC may include a base layer such as flexible polyethylene terephthalate and an adhesive disposed on top and bottom surfaces of the base layer. The plate PLT and the second panel protection layer PPL2 may be spaced apart from each other by the spacer SPC so that the bendable area BA has a predetermined curvature. The spacer SPC may have a thickness of about 47 micrometers (μm) in the third direction DR3.

It is possible that the cover layer CVL, the plate PLT, and the spacer SPC may extend further outward than the first panel protection layer PPL1 so as to be adjacent to the bendable area BA. In this case, when the bendable area BA is bent, the bendable area BA may contact the cover layer CVL, the plate PLT, and the spacer SPC, and thus the bendable area BA may be damaged.

In an embodiment of the inventive concepts, because the cover layer CVL, the plate PLT, and the spacer SPC may be disposed inside a length of the first panel protection layer PPL1 so as not overlap the bendable area BA. Therefore, when the bendable area BA is bent, the bendable area BA may not contact the cover layer CVL, the plate PLT, and the spacer SPC. As a result, the bendable area BA may be prevented from being damaged.

The second panel protection layer PPL2 may be disposed between the spacer SPC and the second area AA2. The fifth adhesion layer AL5 may be further disposed between the second panel protection layer PPL2 and the second area AA2.

When viewed on the plane, one side of the second panel protection layer PPL2 may be spaced apart from a second boundary BP2 by a gap G8 between the bendable area BA and the second area AA2. The second boundary BP2 may overlap with the first boundary BP1, but is not limited thereto, and the second boundary BP2 may not overlap the first boundary BP1.

One side of the second panel protection layer PPL2 may be spaced further apart from the first boundary BP1 or the second boundary BP2 than one side of the first panel protection layer PPL1. A difference of the gap G8 and the gap G7. The cover layer CVL may be disposed between one side of the second panel protection layer PPL2 and one side of the first panel protection layer PPL1.

One side of the protection layer BPL disposed under the second area AA2 may be further spaced apart from the second boundary BP2 than one side of the third adhesion layer AL3. When viewed in the second direction DR2, one side of the protection layer BPL disposed under the second area AA2 may be disposed to the inside of the display device DD rather than one side of the protection layer BPL disposed on the first area AA1.

A gap GP4 between one side of the cover layer CVL and one side of the first panel protection layer PPL1 may be about 0.15 mm±0.15 mm. A gap GP5 between one side of the plate PLT and one side of the first panel protection layer PPL1 may be about 0.15 mm±0.15 mm. A gap GP6 between one side of the spacer SPC and one side of the first panel protection layer PPL1 may be about 0.15 mm±0.15 mm.

A gap GP7 between the first boundary BP1 and one side of the first panel protection layer PPL1 may be about 0.0095 mm±0.125 mm. A gap GP8 between the second boundary BP2 and one side of the second panel protection layer PPL2 may be about 0.089 mm±0.125 mm. When the value of the gap GP7 is negative, the first panel protection layer PPL1 may protrude toward the bendable area BA through the first boundary BP1. When the value of the gap GP8 is negative, the second panel protection layer PPL2 may protrude toward the bendable area BA through the second boundary BP2.

The display device DD includes a first step compensation layer DHC1, a second step compensation layer DHC2, a first insulation tape ITP1, a second insulation tape ITP2, a conductive layer CTL, and a printed circuit board PCB. The first step compensation layer DHC1 may be spaced apart from one side of the protection layer BPL disposed under the second area AA2. The first step compensation layer DHC1 may be disposed under the second area AA2 between the protection layer BPL and the data driver DDV.

The second step compensation layer DHC2 may be disposed under the first step compensation layer DHC1 to extend below the protection layer BPL adjacent to the first step compensation layer DHC1. The first and second step compensation layers DHC1 and DHC2 may be spaced apart from the second boundary BP2.

Each of the first step compensation layer DHC1 and the second step compensation layer DHC2 may be defined as a double-sided tape. For example, each of the first step compensation layer DHC1 and the second step compensation layer DHC2 may include a base layer such as polyethylene terephthalate having flexibility and an adhesive disposed on top and bottom surfaces of the base layer. The adhesive may include an acrylic adhesive. However, the materials of the base layer and the adhesive are not limited thereto.

The first step compensation layer DHC1 may be attached to the lower surface of the second area AA2 of the display panel DP. The second step compensation layer DHC2 may be attached to a bottom surface of the first step compensation layer DHC1 and a bottom surface of the protection layer BPL.

The first step compensation layer DHC1 may have the same thickness as the protection layer BPL in the third direction DR3. For example, the first step compensation layer DHC1 may have a thickness of about 80 micrometers (μm).

The sum of the thickness of the first step compensation layer DHC1 and the thickness of the second step compensation layer DHC2 may be the same as that of the data driver DDV in the third direction DR3. For example, the data driver DDV may have a thickness of about 180 micrometers (μm), and the second step compensation layer DHC2 may have a thickness of about 100 micrometers (μm) in the third direction DR3. In the second area AA2, the stepped portion formed by the protection layer BPL and the data driver DDV may be compensated by the first and second step compensation layers DHC1 and DHC2.

The first insulation tape ITP1 may be disposed under the second step compensation layer DHC2 to extend below the data driver DDV and the printed circuit board PCB at a different level. The first insulation tape ITP1 may be disposed under the second area AA2 to cover the data driver DDV. The first insulation tape ITP1 may include a base layer including an insulation material and having flexible and an adhesive disposed on top and bottom surfaces of the base layer. The first insulation tape ITP1 may have a thickness of about 30 micrometers (μm) in the third direction DR3.

The conductive layer CTL may be disposed under the first insulation tape ITP1 and follow the contour of the first insulation tape ITP1. The conductive layer CTL may include a conductive material. The conductive layer CTL may be defined as an anti-static layer. The conductive layer CTL may have a thickness of about 30 micrometers (μm) in the third direction DR3.

The second insulation tape ITP2 may be disposed under the conductive layer CTL and follow the contour of the conductive layer CTL. The second insulation tape ITP2 may include a base layer including an insulation material and having flexible and an adhesive disposed on a top surface of the base layer. The second insulation tape ITP2 may include a coating layer disposed on a bottom surface of the base layer. Because the adhesive is not disposed on the bottom surface of the base layer of the second insulation tape ITP2, when the display device DD is accommodated in the case, the second insulation tape ITP2 may not be attached to the case.

The second insulation tape ITP2 may not be disposed on the first portion PT1 of the conductive layer CTL adjacent to one side of the conductive layer CTL. One side of the conductive layer CTL may be adjacent to the second boundary BP2. The first portion PT1 may be exposed to the outside. The second insulation tape ITP2 may have a thickness of about 15 micrometers (μm) in the third direction DR3.

One side of the second step compensation layer DHC2 adjacent to the second boundary BP2, one side of the first insulation tape ITP1 adjacent to the second boundary BP2, and one side of the conductive layer CTL adjacent to the second boundary BP2 may be spaced apart from the second boundary BP2 and overlap with each other. These layers may be spaced from the second boundary BP2 by a distance DT6. One side of the second step compensation layer DHC2, one side of the first insulation tape ITP1, and one side of the conductive layer CTL may be spaced further apart from the second boundary BP2 than one side of the cover layer CVL.

A gap GP9 between one side of the protection layer BPL disposed under the second area AA2 and one side of the second panel protection layer PPL2 may be about 1.314 mm±0.141 mm. A distance DT5 between one side of the second step compensation layer DHC2 and one side of the second panel protection layer PPL2 may be about 0.2 mm. The distance DT6 between one side of the second step compensation layer DHC2 and the second boundary BP2 may be about 0.35 mm.

The printed circuit board PCB may be spaced apart from the data driver DDV and disposed under the second area AA2. The first insulation tape ITP1, the second insulation tape IPT2, and the conductive layer CTL may extend toward the printed circuit board PCB so as to be disposed under the printed circuit board PCB.

The second step compensation layer DHC2, the first insulation tape ITP1, and the conductive layer CTL may be disposed up to the second boundary BP2 (not illustrated). In this case, the second step compensation layer DHC2, the first insulation tape ITP1, and the conductive layer CTL may be delaminated from the protection layer BPL by stress generated between the bendable area BA and the second area AA2.

In an embodiment of the inventive concepts, the second step compensation layer DHC2, the first insulation tape ITP1, and the conductive layer CTL may be spaced apart from the second boundary BP2 so as to be disposed below the flat second area AA2. Therefore, the second step compensation layer DHC2, the first insulation tape ITP1, and the conductive layer CTL may not be delaminated from the protection layer BPL.

According to an embodiment of the inventive concepts, the laminated structure may be optimized by providing the various stepped portions on the layers of the portion adjacent to the bendable area BA. As a result, the display device DD may be prevented from being damaged when being bent and un-bent.

Figure 12:
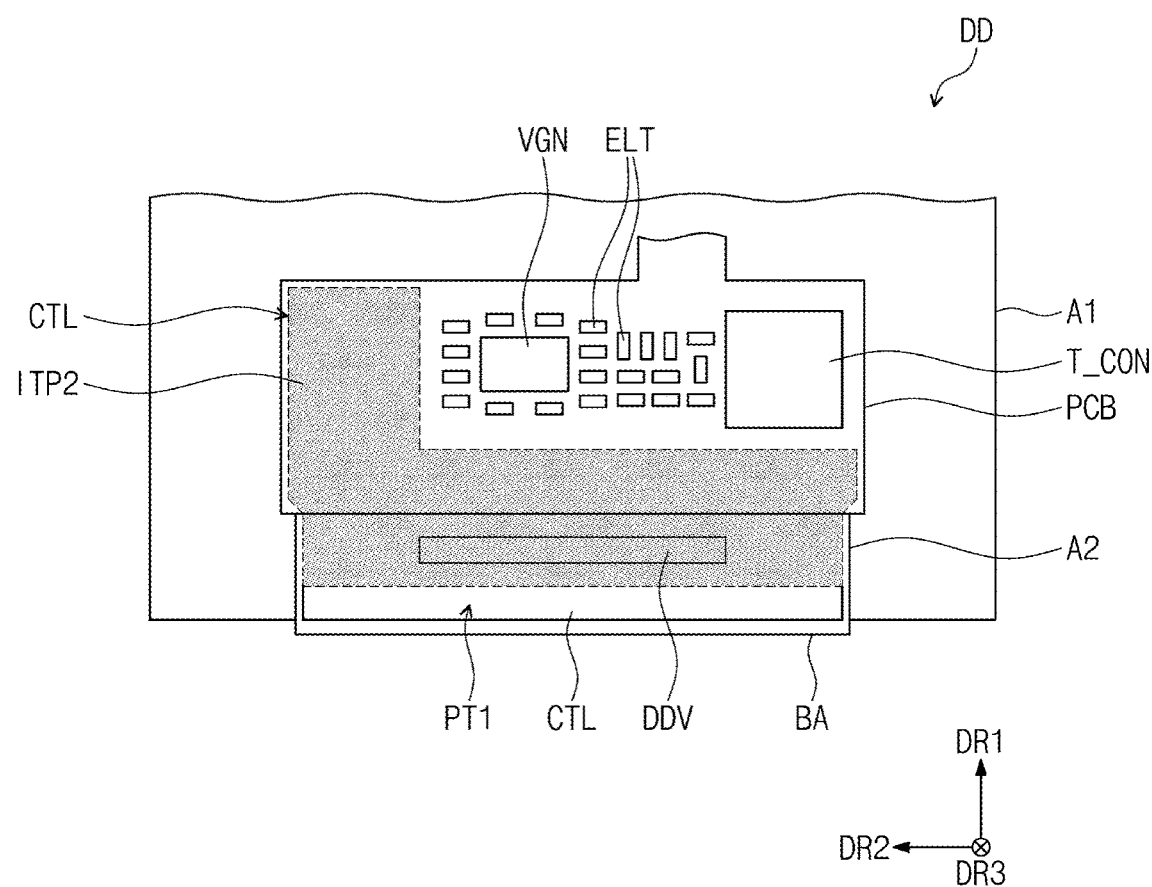
FIG. 12 is a view illustrating a rear surface of the display device adjacent to the bendable area of FIG. 10.

FIG. 12 is a view illustrating a rear surface of the display device DD adjacent to the bendable area.

Referring to FIG. 12, the display device DD includes a printed circuit board PCB, a plurality of elements ELT disposed on the printed circuit board PCB, a timing controller T_CON disposed on the printed circuit board PCB, and a voltage generator VGN disposed on the printed circuit board PCB. The printed circuit board PCB may have a flexible type or a rigid type.

The printed circuit board PCB may be connected to the pads PD disposed on the second area AA2. The timing controller T_CON may be connected to the data driver DDV, the scan driver SDV, and the emission driver EDV through the pads PD. The voltage generator VGN may be connected to the first and second power lines PL1 and PL2 through the pads PD.

Although not illustrated, an input sensing controller configured to control the operation of the input sensing part ISP may be further disposed on the printed circuit board PCB. The elements ELT may include elements such as resistors and capacitors.

The timing controller T-CON may generate scan control signals, data control signals, and emission control signals to provide the signals to the data driver DDV, the scan driver SDV, and the emission driver EDV, respectively. The voltage generator VGN may generate a first voltage and a second voltage to provide the voltages to the first power line PL1 and the second power line PL2, respectively.

The second insulation tape ITP2 may be disposed to cover the data driver DDV and extend onto the printed circuit board PCB. For example, in FIG. 12, the second insulation tape ITP2 is illustrated with a gray color, and the boundary of the second insulation tape ITP2 is illustrated as dotted lines. The second insulation tape ITP2 may be disposed at one side of the printed circuit board PCB. The second insulation tape ITP2 may not overlap the elements ELT, the timing controller T_CON, and the voltage generator VGN.

The conductive layer CTL may be disposed to overlap the second insulation tape ITP2. Although not illustrated, the conductive layer CTL may be connected to a ground layer disposed in the printed circuit board PCB. External static electricity may be applied to a first portion PT1 of the conductive layer CTL, which is exposed to the outside. The static electricity may be discharged through the conductive layer CTL and the ground layer. Accordingly, the elements in the display module DM may be prevented from being damaged by the external static electricity.

Figure 13:
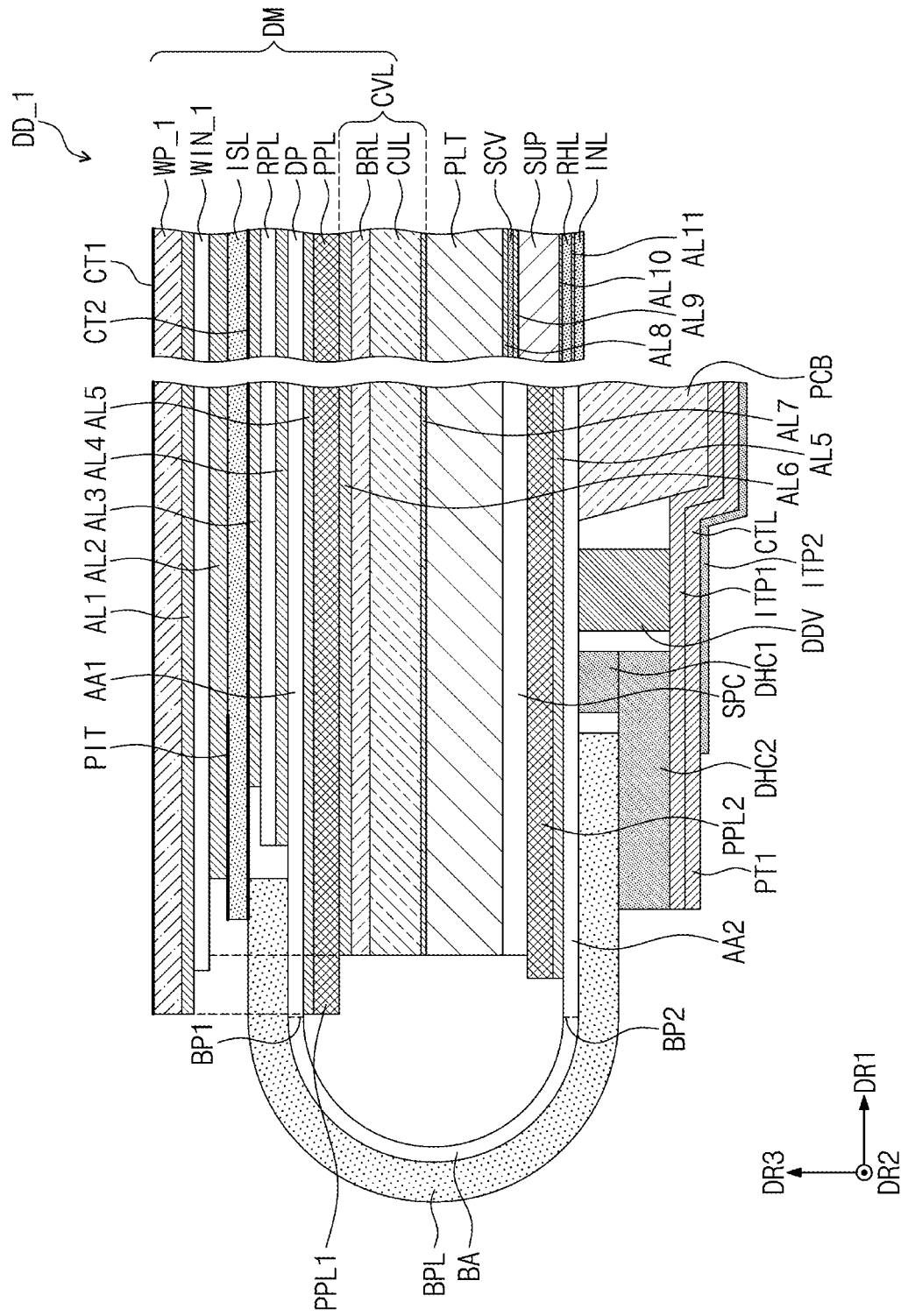
FIG. 13 is a view illustrating a configuration of a display device according to another embodiment of the inventive concept.

FIG. 13 is a view illustrating a configuration of a display device according to another embodiment of the inventive concepts.

For convenience of description, FIG. 13 illustrates a cross-sectional view corresponding to the cross-section view of FIG. 10. Hereinafter, the display device DD_1 illustrated in FIG. 13 will be mainly described with respect to constituents different from the display device DD illustrated in FIG. 10.

Referring to FIG. 13, a length of a window protection layer WP_1 and a length of a window WIN_1 in the first direction DR1 may be variously set, as long as the window protection layer WP_1 and the window WIN_1 do not overlap a bendable area BA. For example, when viewed on a plane, one side of the window protection layer WP_1 may overlap with one side of the first panel protection layer PPL1. Also, one side of the window WIN_1 may be disposed between one side of the window protection layer WP_1 and one side of a cover layer CVL.

Because the window protection layer WP_1 and the window WIN_1 do not overlap the bendable area BA, even if the display device DD_1 is folded, the window protection layer WP_1 and the window WIN_1 may not protrude outside the bendable area BA. As a result, the window protection layer WP_1 and the window WIN_1 may be prevented from being damaged.

Figure 14:
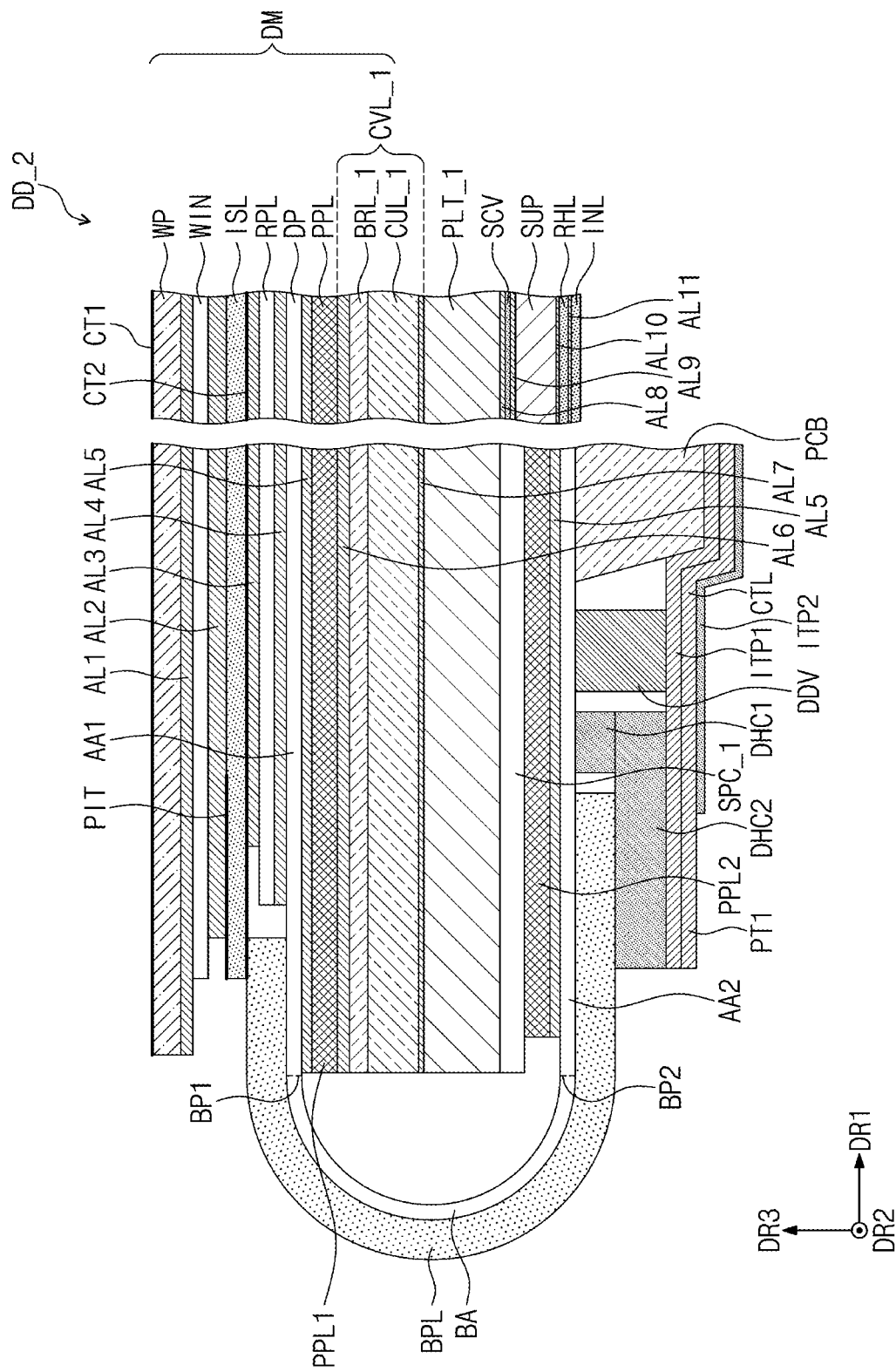
FIGS. 14, 15, and 16 are views illustrating configurations of cover layers of display devices according to another embodiment of the inventive concepts.
Figure 15:
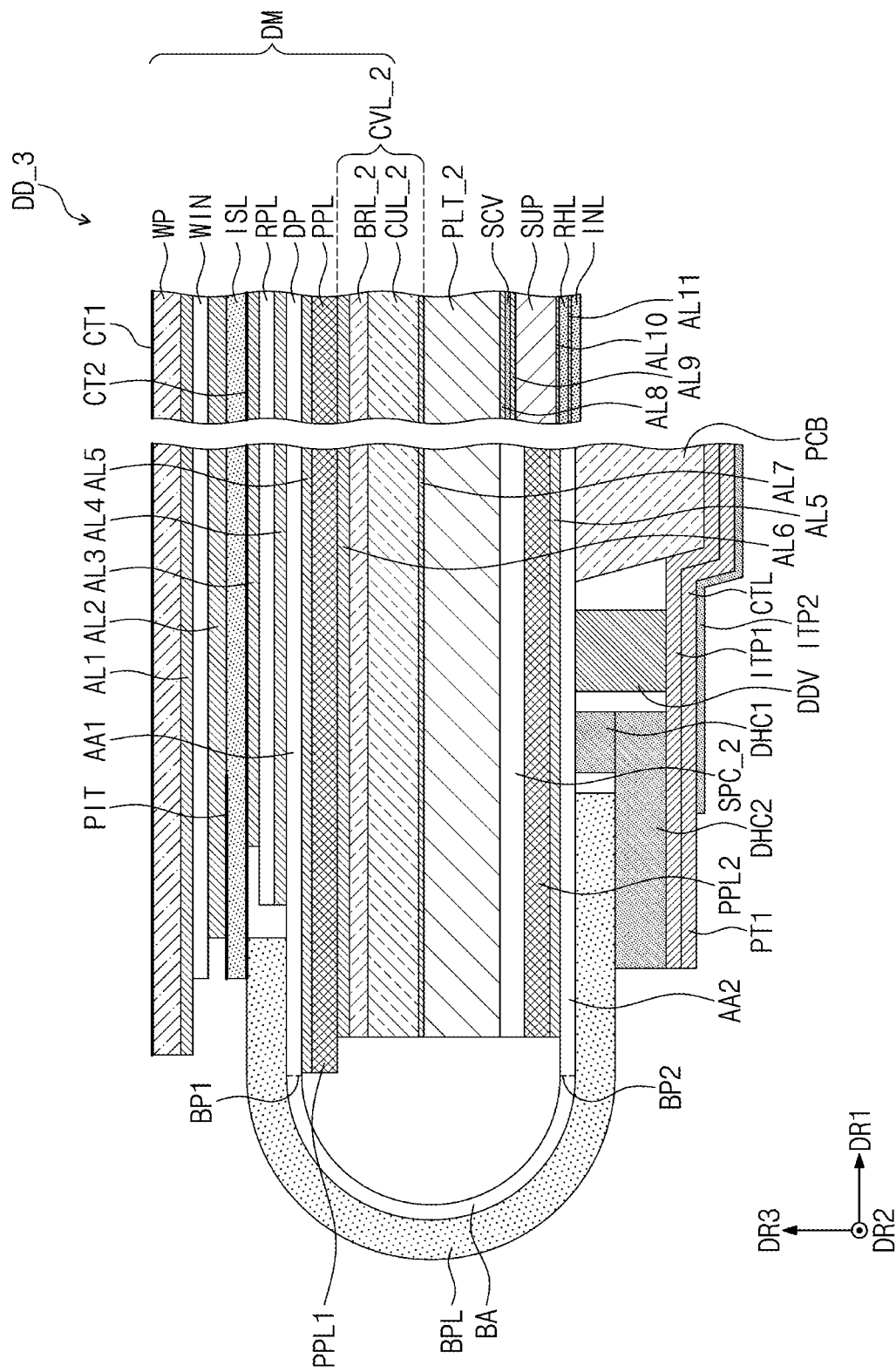
Figure 16:
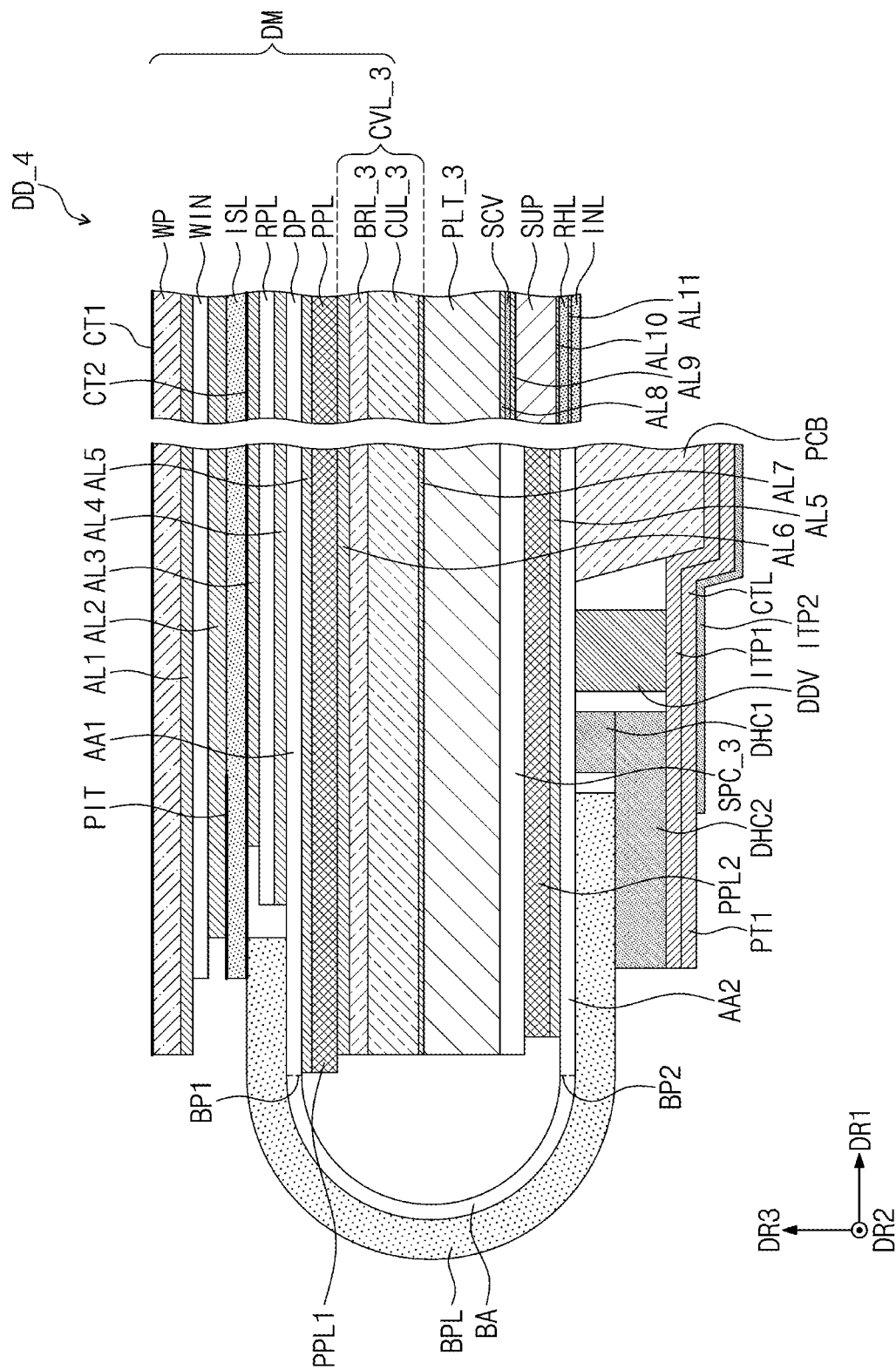

FIGS. 14 to 16 are views illustrating configurations of cover layers of display devices according to another embodiment of the inventive concepts.

FIGS. 14 and 16 are cross-sectional views corresponding to the cross-section view of FIG. 10. Hereinafter, cover layers CVL_1, CVL_2, and CVL_3 of display devices DD_2, DD_3, and DD_4 illustrated in FIGS. 14 to 16 will be mainly described with reference to constituents different from the cover layer CVL of the display device DD illustrated in FIG. 10.

Referring to FIG. 14, a length of the cover layer CVL_1 in the first direction DR1 may be variously set as long as the cover layers CLV 1 does not overlap a bendable area BA and extend beyond the first boundary BP1 or second boundary BP2. For example, when viewed on a plane, one side of the cover layer CVL_1 may overlap with one side of a first panel protection layer PPL1. Therefore, one side of a barrier layer BRL_1 and one side of a cushion layer CUL_1 may overlap with one side of a first panel protection layer PPL1. When viewed on a plane, one side of a plate PLT_1 and one side of a spacer SPC_1 may overlap with one side of the cover layer CVL_1.

The cover layer CVL_1, the plate PLT_1, and the spacer SPC_1 may not overlap the bendable area BA. Therefore, even if the bendable area BA is bent, the bendable area BA may not contact the cover layer CVL_1, the plate PLT_1, and the spacer SPC_1. As a result, the bendable area BA may be prevented from being damaged.

Referring to FIG. 15, when viewed on a plane, one side of the cover layer CVL_2 may overlap with one side of a second panel protection layer PPL2. Therefore, one side of a barrier layer BRL_2 and one side of a cushion layer CUL_2 may overlap with one side of a second panel protection layer PPL2. When viewed on a plane, one side of a plate PLT_2 and one side of a spacer SPC_2 may overlap with one side of the cover layer CVL_2.

Because the cover layer CVL_2, the plate PLT_2, and the spacer SPC_2 do not overlap the bendable area BA and extend beyond the first boundary BP1 or second boundary BP2, even if the bendable area BA is bent, the bendable area BA may not contact the cover layer CVL_2, the plate PLT_2, and the spacer SPC_2.

Referring to FIG. 16, when viewed on the plane, one side of a cover layer CVL_3 may be disposed between one side of a first panel protection layer PPL1 and one side of a second panel protection layer PPL2. Accordingly, one side of a barrier layer BRL_3 and one side of a cushion layer CUL_3 may be disposed between one side of the first panel protection layer PPL1 and one side of the second panel protection layer PPL2. When viewed on the plane, one side of a plate PLT_3 and one side of a spacer SPC_3 may overlap with one side of the cover layer CVL_3.

Because the cover layer CVL_3, the plate PLT_3, and the spacer SPC_3 do not overlap the bendable area BA and extend beyond the first boundary BP1 or second boundary BP2, even if the bendable area BA is bent, the bendable area BA may not contact the cover layer CVL_3, the plate PLT_3, and the spacer SPC_3.

Figure 17:
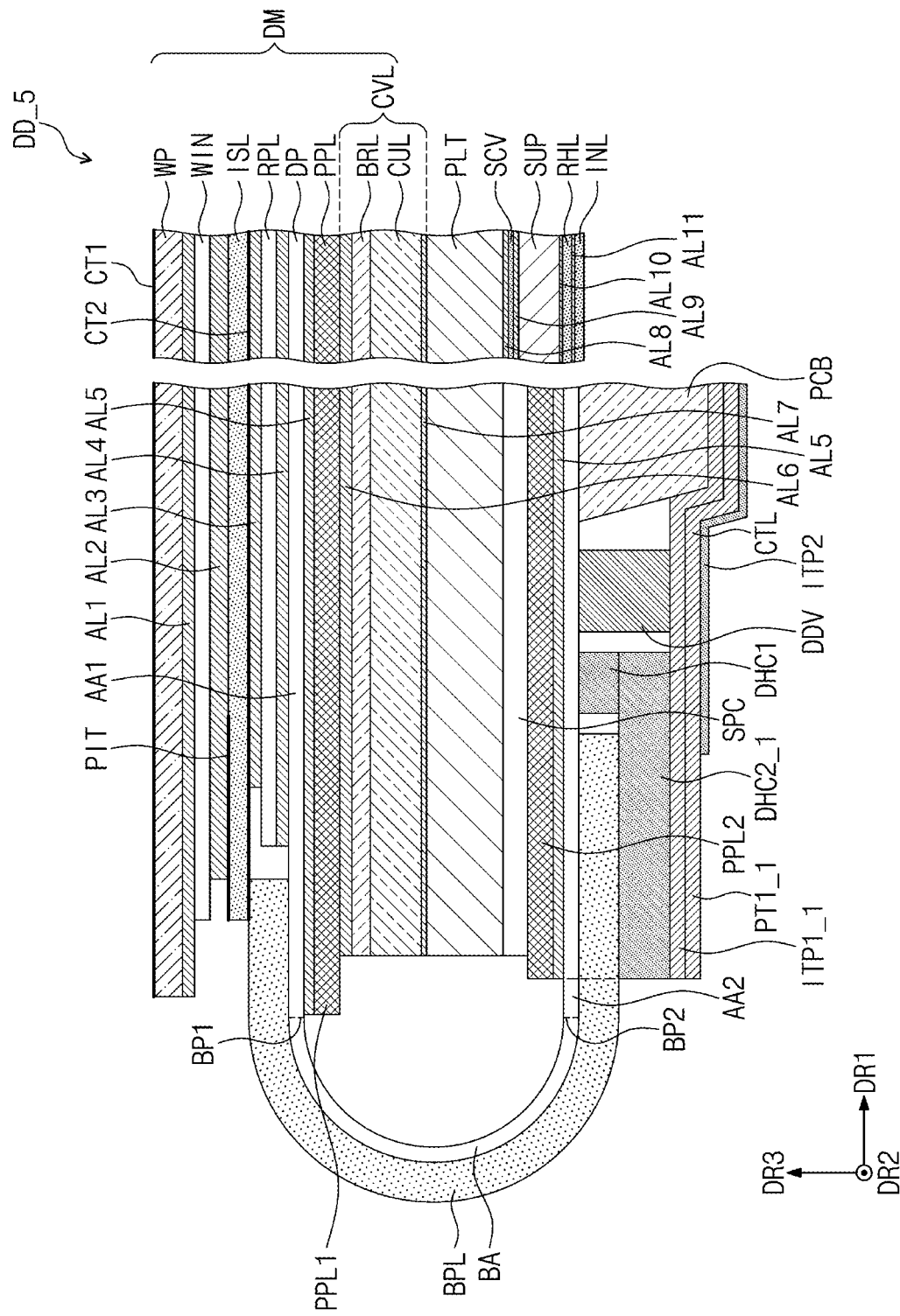
FIG. 17 is a view illustrating a configuration of a display device according to another embodiment of the inventive concepts.

FIG. 17 is a view illustrating a configuration of a display device according to another embodiment of the inventive concepts.

For convenience of description, FIG. 17 illustrates a cross-sectional view corresponding to the cross-section view of FIG. 10. Hereinafter, a display device DD_4 illustrated in FIG. 17 will be mainly described with respect to constituents different from the display device DD illustrated in FIG. 10.

Referring to FIG. 17, one side of a second step compensation layer DHC2_1, one side of a first insulation tape ITP1_1, and one side of a conductive layer CTL_1 in the first direction DR1 may be disposed on various portions if each one side is spaced a predetermined distance from a second boundary BP2. For example, one side of the second step compensation layer DHC2_1, one side of the first insulation tape ITP1_1, and one side of the conductive layer CTL_1 may overlap with one side of a second panel protection layer PPL2.

Because the second step compensation layer DHC2_1, the first insulation tape ITP1_1, and the conductive layer CTL_1 are spaced apart from the second boundary BP2 and disposed under the flat second area AA2, the second step compensation layer DHC2_1, the first insulation tape ITP1_1, and the conductive layer CTL_1 may not be delaminated from the protection layer BPL.

According to embodiments of the inventive concepts, various portions may be provided on the layers of the portion adjacent to the bendable area to optimize the stacked structure. As a result, the display device may be prevented from being damaged.

It will be apparent to those skilled in the art that various modifications and variations can be made in the inventive concepts. Thus, it is intended that the inventive concepts cover the modifications and variations of this invention provided they come within the scope of the appended claims and their equivalents. Thus, to the maximum extent allowed by law, the scope of the present invention is to be determined by the broadest permissible interpretation of the following claims and their equivalents, and shall not be restricted or limited by the foregoing detailed description.

What is claimed is:
1. A display device comprising:
 a display panel comprising a first area, a second area, and a bendable area between the first area and the second area, wherein the bendable area is bent so that the second area is disposed below the first area;

a driving integrated circuit (IC) disposed below the second area;
a window disposed on the first area;
a window protection layer disposed on the window; and
a first panel protection layer disposed below the first area,
wherein, one side of the window protection layer and one side of the window are spaced apart from a first boundary between the first area and the bendable area in a horizontal direction, and
the one side of the window protection layer protrudes closer to the first boundary than the one side of the window in the horizontal direction.

2. The display device of claim 1, further comprising:
an impact absorption layer disposed between the window and the first area; and
an anti-reflection layer disposed between the impact absorption layer and the first area,
wherein, when viewed on the plane, one side of the impact absorption layer overlaps with the one side of the window, and
one side of the anti-reflection layer is further spaced apart from the first boundary than the one side of the impact absorption layer.

3. The display device of claim 2, further comprising:
a first coating layer applied on a top surface of the window protection layer; and
a second coating layer applied on a bottom surface of the impact absorption layer.

4. The display device of claim 2, further comprising:
a first adhesion layer disposed between the window protection layer and the window;
a second adhesion layer disposed between the window and the impact absorption layer;
a third adhesion layer disposed between the impact absorption layer and the anti-reflection layer; and
a fourth adhesion layer disposed between the anti-reflection layer and the first area.

5. The display device of claim 4, wherein, when viewed on the plane, one side of the first adhesion layer overlaps with the one side of the window protection layer,
one side of the second adhesion layer is disposed between the one side of the window and the one side of the anti-reflection layer,
one side of the third adhesion layer is further spaced apart from the first boundary than the one side of the anti-reflection layer, and
one side of the fourth adhesion layer overlaps with the one side of the anti-reflection layer.

6. The display device of claim 2, further comprising a protection layer spaced apart from the anti-reflection layer and disposed between the impact absorption layer and the first area and extending to the bendable area and a portion of the second area, which is adjacent to the bendable area.

7. The display device of claim 6, further comprising:
a first step compensation layer disposed between the protection layer and the driving IC; and
a second step compensation layer disposed below the first step compensation layer to extend below a portion of the protection layer, which is adjacent to the first step compensation layer,
wherein the second step compensation layer is spaced apart from a second boundary between the bendable area and the second area.

8. The display device of claim 7, wherein the first step compensation layer has the same thickness as the protection layer in a direction perpendicular to a plane of the first area.

9. The display device of claim 7, wherein the sum of thicknesses of the first and second step compensation layers is the same as that of the driving IC in a direction perpendicular to a plane of the first area.

10. The display device of claim 7, further comprising:
a first insulation tape disposed below the second step compensation layer to extend below the driving IC;
a conductive layer disposed below the first insulation tape; and
a second insulation tape disposed below the conductive layer.

11. The display device of claim 10, wherein, when viewed on the plane, one side of the second step compensation layer, which is adjacent to the second boundary, one side of the first insulation tape, which is adjacent to the second boundary, and one side of the conductive layer, which is adjacent to the second boundary, are spaced apart from the second boundary to overlap with each other.

12. The display device of claim 11, further comprising a second panel protection layer disposed below the first panel protection layer and further spaced apart from the second boundary than the first panel protection layer,
wherein, when viewed on the plane, the one side of the second step compensation layer overlaps with one side of the second panel protection layer.

13. The display device of claim 11, wherein the second insulation tape does not overlap with a portion of the conductive layer, which is adjacent to the one side of the conductive layer.

14. The display device of claim 1, wherein, one side of the first panel protection layer protrudes closer to the first boundary than the one side of the window protection layer in the horizontal direction.

15. The display device of claim 14, further comprising a cover layer disposed between the first panel protection layer and the second area and spaced apart from the bendable area.

16. The display device of claim 15, wherein, when viewed on the plane, one side of the cover layer is further spaced apart from the first boundary than the one side of the first panel protection layer.

17. The display device of claim 15, wherein, when viewed on the plane, the one side of the window protection layer overlaps with the one side of the first panel protection layer, and
one side of the window is disposed between the one side of the window protection layer and the one side of the cover layer.

18. The display device of claim 15, wherein, one side of the cover layer protrudes closer to the one side of window protection layer than the one side of the window in the horizontal direction.

19. The display device of claim 15, wherein, when viewed on the plane, one side of the cover layer overlaps with the one side of the first panel protection layer.

20. The display device of claim 15, further comprising:
a plate disposed between the cover layer and the second area;
a spacer disposed between the plate and the second area; and
a second panel protection layer disposed between the spacer and the second area.

21. The display device of claim 20, wherein, when viewed on the plane, one side of the plate and one side of the spacer overlap with one side of the cover layer.

22. The display device of claim 20, wherein, when viewed on the plane, one side of the second panel protection layer is further spaced apart from the first boundary than the one side of the first panel protection layer, and
   one side of the cover layer overlaps with the one side of the second panel protection layer.

23. The display device of claim 20, wherein, when viewed on the plane, one side of the second panel protection layer is further spaced apart from the first boundary than the one side of the first panel protection layer, and
   one side of the cover layer is disposed between the one side of the first panel protection layer and the one side of the second panel protection layer.

24. The display device of claim 20, wherein, when viewed on the plane, one side of the second panel protection layer is disposed between the one side of the first panel protection layer and one side of the cover layer.

25. The display device of claim 20, further comprising a fifth adhesion layer disposed between the first area and the first panel protection layer,
wherein the cover layer comprises:
   a barrier layer disposed below the first panel protection layer;
   a cushion layer disposed below the barrier layer;
   a sixth adhesion layer disposed between the first panel protection layer and the barrier layer; and
   a seventh adhesion layer disposed between the cushion layer and the plate,
wherein one side of the fifth adhesion layer overlaps with the one side of the first panel protection layer,
one side of the barrier layer, one side of the cushion layer, one side of the sixth adhesion layer, and one side of the seventh adhesion layer overlap with each other, and
the cushion layer is disposed directly on a bottom surface of the barrier layer.

* * * * *